US011171241B2

(12) United States Patent
Ogawa

(10) Patent No.: US 11,171,241 B2
(45) Date of Patent: Nov. 9, 2021

(54) TFT SUBSTRATE

(71) Applicant: Japan Display Inc., Tokyo (JP)

(72) Inventor: Akihiro Ogawa, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 16/930,744

(22) Filed: Jul. 16, 2020

(65) Prior Publication Data

US 2020/0350438 A1 Nov. 5, 2020

Related U.S. Application Data

(63) Continuation of application No. PCT/JP2018/047970, filed on Dec. 26, 2018.

(30) Foreign Application Priority Data

Jan. 19, 2018 (JP) .............................. JP2018-007271

(51) Int. Cl.
*H01L 29/786* (2006.01)
(52) U.S. Cl.
CPC .... *H01L 29/78618* (2013.01); *H01L 29/7869* (2013.01); *H01L 29/78696* (2013.01)
(58) Field of Classification Search
CPC ........... H01L 29/78618; H01L 29/7869; H01L 29/78696
USPC ....................................................... 257/288
See application file for complete search history.

(56) References Cited

U.S. PATENT DOCUMENTS

2010/0232004 A1* 9/2010 Hiroshima ............ H01L 27/124
359/259

FOREIGN PATENT DOCUMENTS

| JP | 2010-239108 | 10/2010 |
| JP | 2010-239108 A | 10/2010 |
| JP | 2011-221125 | 11/2011 |

OTHER PUBLICATIONS

International Search Report issued in connection with PCT/JP2018/047970, dated Mar. 5, 2019. (1 page).
Japanese Office Action dated Jul. 9, 2021 in corresponding Japanese Application No. 2018-007271.
Japanese Office Action dated Jul. 20, 2021 in corresponding Japanese Application No. 2018-007271.

* cited by examiner

*Primary Examiner* — Tong-Ho Kim
(74) *Attorney, Agent, or Firm* — K&L Gates LLP

(57) ABSTRACT

A thin film transistor (TFT) substrate includes: a first gate line and a second gate line extending in a first direction; a signal line intersecting with the first gate line and the second gate line in a plan view; a semiconductor film coupled to the signal line; a drain electrode coupled to the semiconductor film; a planarizing film covering the signal line and the drain electrode; and a pixel electrode coupled to the drain electrode. The semiconductor film comprises a first linear portion extending parallel to the first gate line and a second linear portion extending parallel to the second gate line. The first and second gate lines are located between the first and second linear portions in the plan view. A first contact hole of the planarizing film coupling the drain electrode to the pixel electrode is located between the first and second gate lines in the plan view.

8 Claims, 32 Drawing Sheets

FIG.22
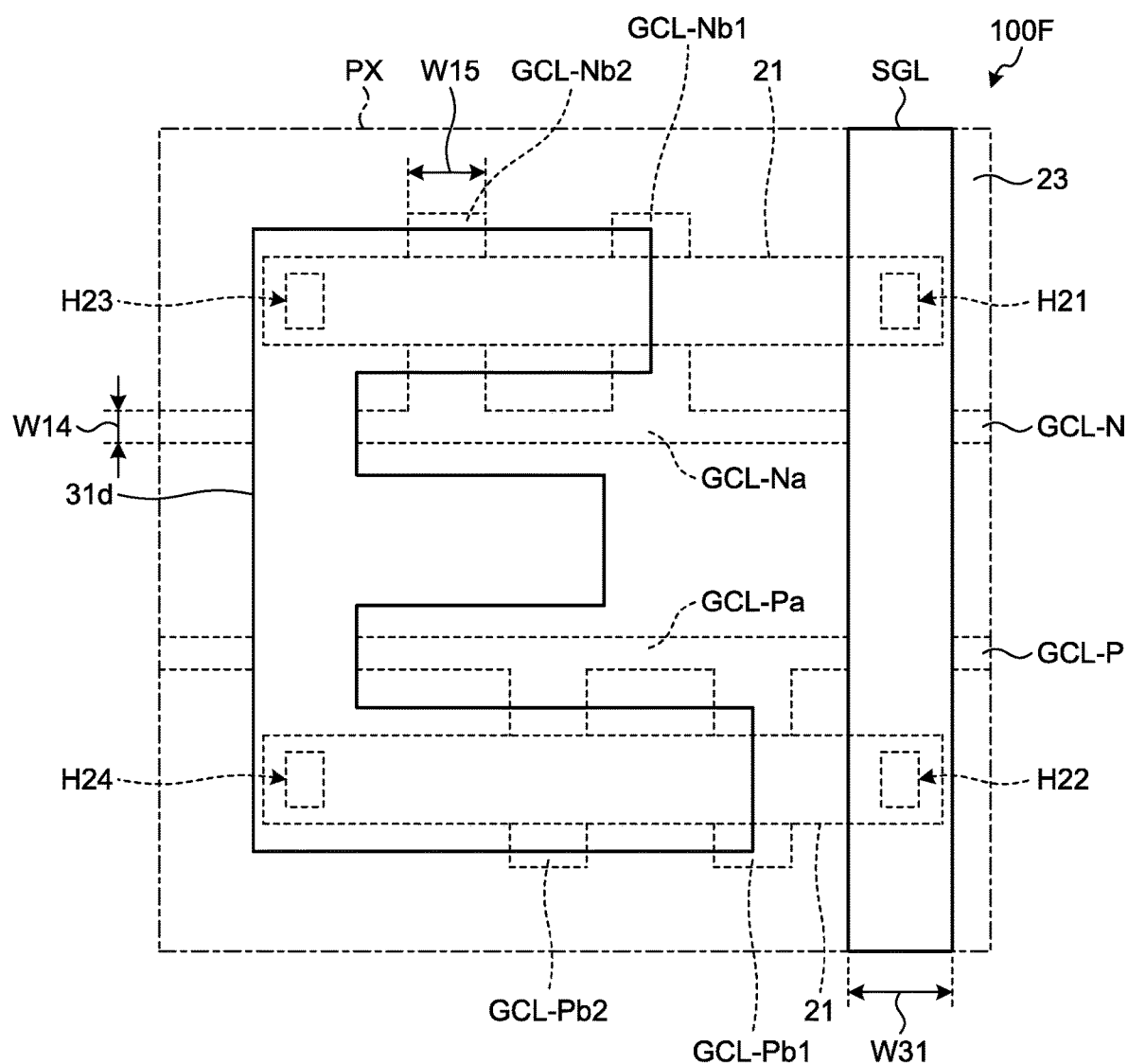
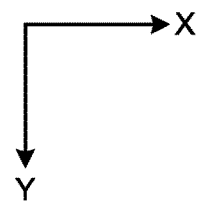

FIG.26
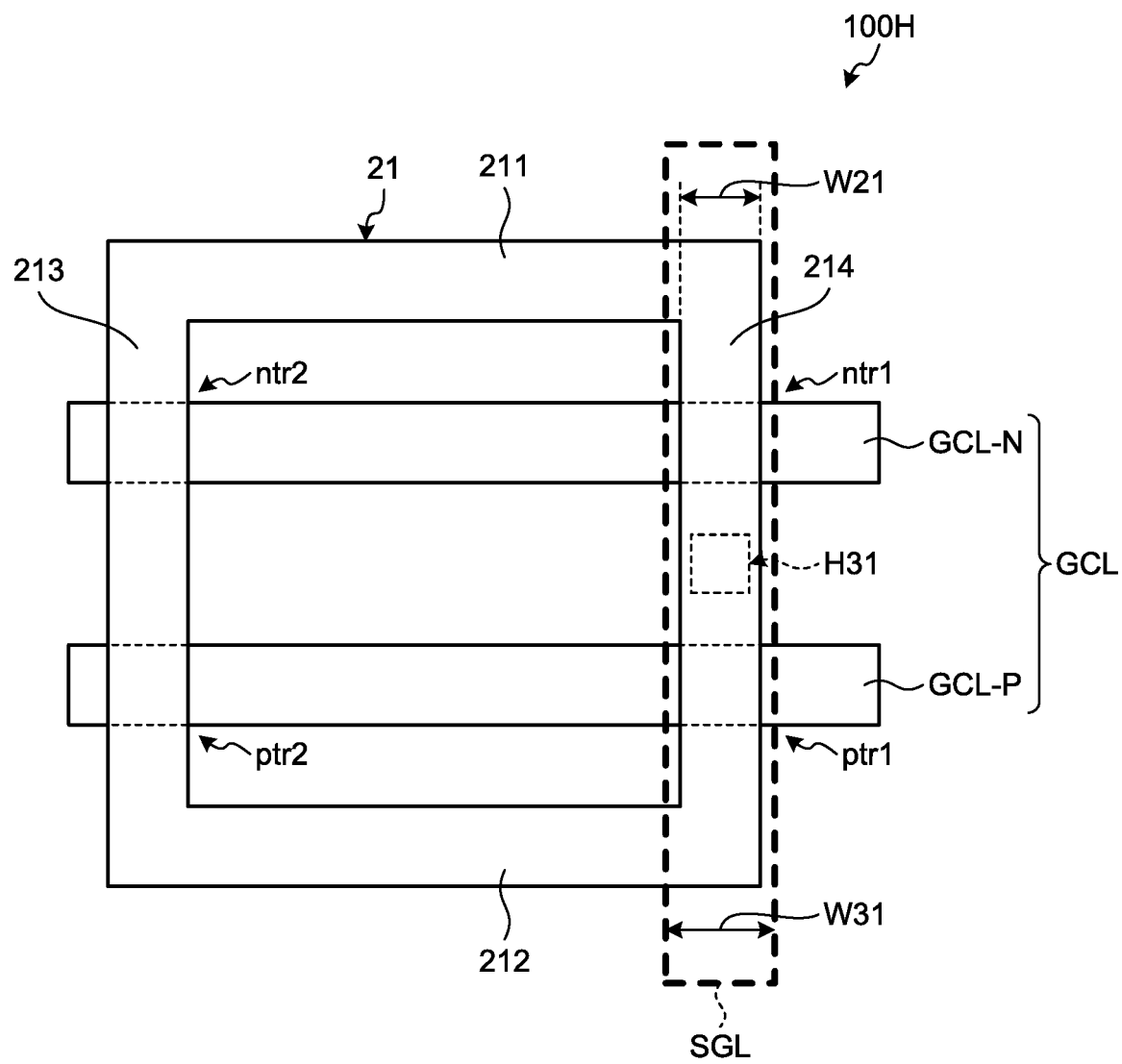
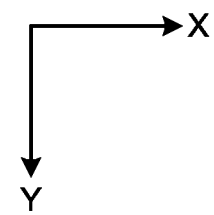

TFT SUBSTRATE

CROSS-REFERENCE TO RELATED APPLICATION

This application claims the benefit of priority from Japanese Patent Application No. 2018-007271 filed on Jan. 19, 2018 and International Patent Application No. PCT/2018/047970 filed on Dec. 26, 2018, the entire contents of which are incorporated herein by reference.

BACKGROUND

1. Technical Field

The present disclosure relates to a thin film transistor (TFT) substrate.

2. Description of the Related Art

Recent years have seen a growing demand for display devices for use in, for example, mobile electronic apparatuses, such as mobile phones and electronic paper. For example, an electrophoretic display (EPD) used in the electronic paper has a memory property to maintain a potential at the time of rewriting an image. After the EPD performs the rewriting once for each frame, the potential at the time of the rewriting is maintained until the EPD performs the rewriting for the next frame. As a result, the EPD can perform low power consumption driving. For example, Japanese Patent Application Laid-open Publication No. 2011-221125 discloses a technique to achieve the low power consumption by configuring pixel transistors of the EPD in a complementary metal-oxide semiconductor (CMOS) configuration obtained by combining p-channel transistors with n-channel transistors.

For example, under an outdoor environment exposed to intense light, the light incident on a display surface may reach the pixel transistors. The intense light entering the pixel transistors generates a photo leakage current due to a photoconductivity effect, and may cause a malfunction of the pixel transistors.

The present disclosure has been made in view of the above-described problem, and an object thereof is to provide a TFT substrate capable of achieving higher reliability.

SUMMARY

According to an aspect, a thin film transistor (TFT) substrate includes: a first gate line and a second gate line extending in a first direction; a signal line intersecting with the first gate line and the second gate line in a plan view; a semiconductor film coupled to the signal line; a drain electrode coupled to the semiconductor film; a planarizing film covering the signal line and the drain electrode; and a pixel electrode coupled to the drain electrode. The semiconductor film comprises a first linear portion extending parallel to the first gate line and a second linear portion extending parallel to the second gate line. The first gate line and the second gate line are located between the first linear portion and the second linear portion in the plan view. A first contact hole of the planarizing film coupling the drain electrode to the pixel electrode is located between the first gate line and the second gate line in the plan view.

According to another aspect, a thin film transistor (TFT) substrate includes: a first gate line; a second gate line parallel to the first gate line; a signal line intersecting with the first gate line and the second gate line in a plan view; and a semiconductor film that intersects with the first gate line and the second gate line in the plan view, and is coupled to the signal line. The semiconductor film comprises a first linear portion parallel to the first gate line, a second linear portion parallel to the second gate line, and a third linear portion parallel to the signal line. The third linear portion couples the first linear portion to the second linear portion.

BRIEF DESCRIPTION OF THE DRAWINGS

FIG. 22 is a plan view illustrating a configuration example of the signal line and a drain in one of the pixels of the TFT substrate according to the second embodiment;

FIG. 26 is a plan view illustrating a configuration example of the gate line, the semiconductor film, and the signal line in one of the pixels of a TFT substrate according to a third embodiment of the present disclosure;

DETAILED DESCRIPTION

Figure 1:
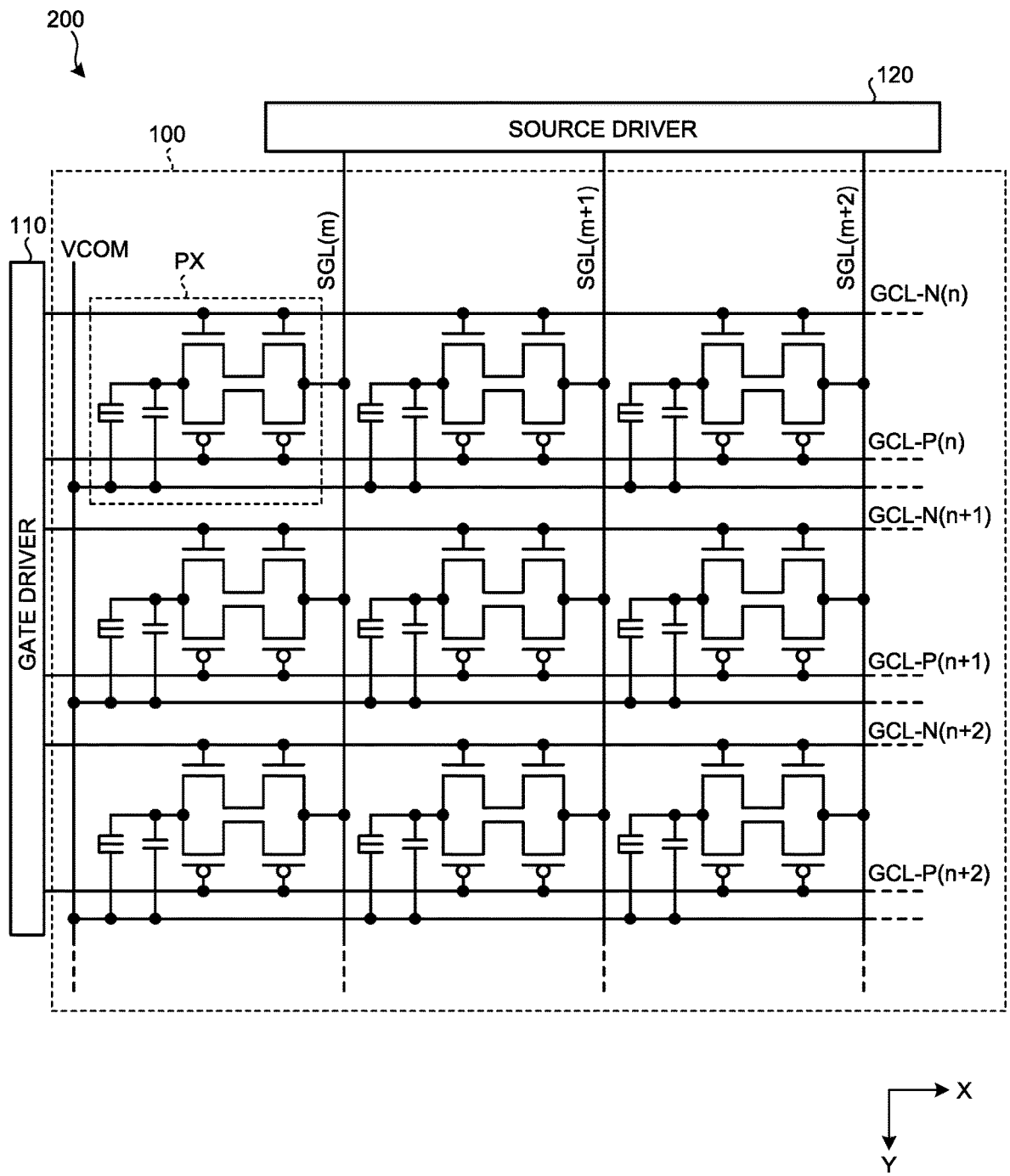
FIG. 1 is a block diagram illustrating a configuration example of a display device according to a first embodiment of the present disclosure.

The following describes modes (embodiments) for carrying out the present disclosure in detail with reference to the drawings. The present disclosure is not limited to the description of the embodiments to be given below. Components to be described below include those easily conceivable by those skilled in the art or those substantially identical thereto. Furthermore, the components to be described below can be combined as appropriate. The disclosure is merely an example, and the present disclosure naturally encompasses appropriate modifications easily conceivable by those skilled in the art while maintaining the gist of the invention. To further clarify the description, widths, thicknesses, shapes, and the like of various parts will be schematically illustrated in the drawings as compared with actual aspects thereof, in some cases. However, they are merely examples, and interpretation of the present disclosure is not limited thereto. The same element as that illustrated in a drawing that has already been discussed is denoted by the same reference numeral through the description and the drawings, and detailed description thereof will not be repeated in some cases where appropriate. In this disclosure, when an element A is described as being "on" another element B, the element A can be directly on the other element B, or there can be one or more elements between the element A and the other element B.

Figure 3:
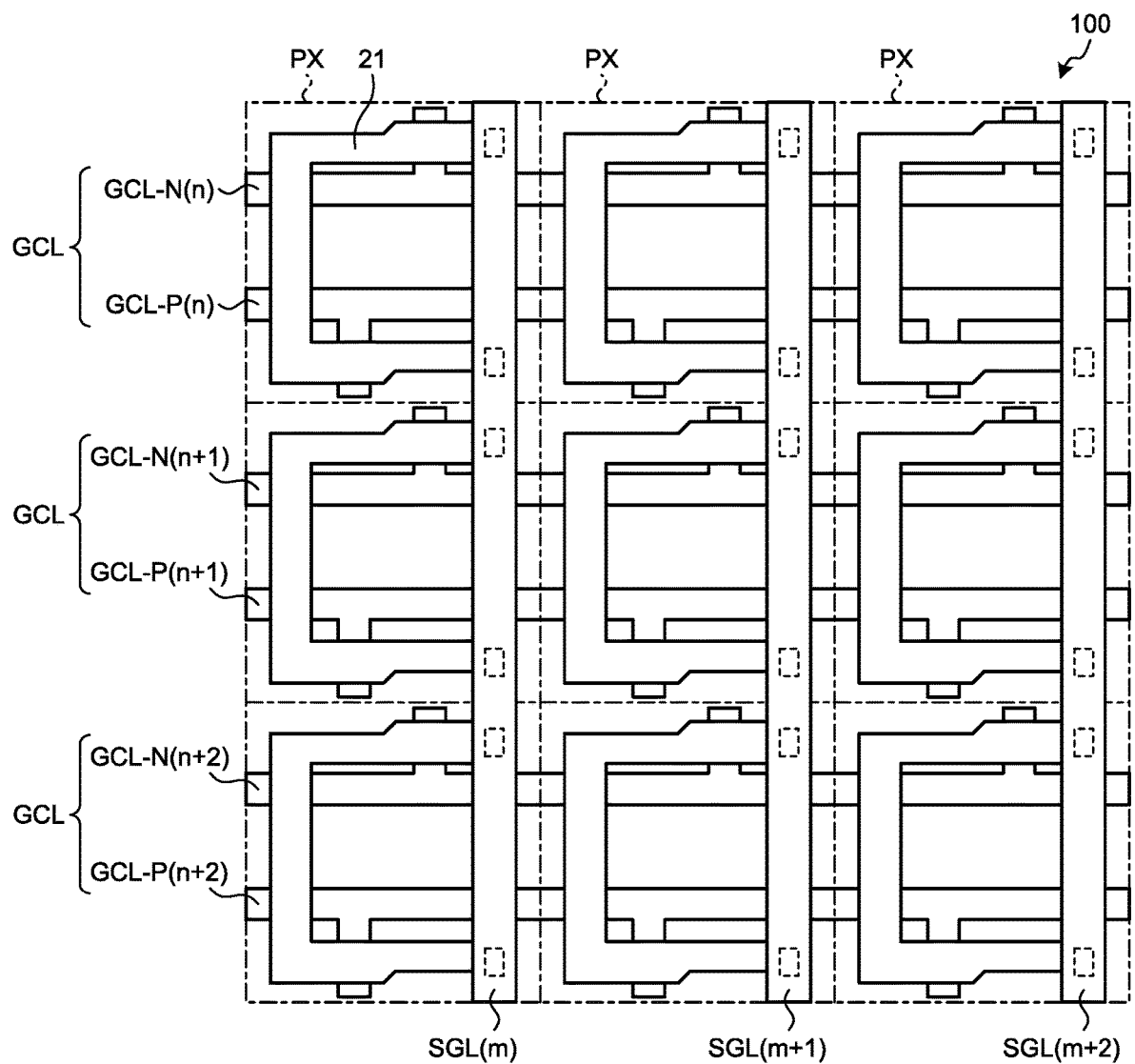
FIG. 3 is a plan view illustrating an arrangement example of a plurality of pixels on the TFT substrate according to the first embodiment.

Herein, the right-left direction in FIG. 3 is denoted as an X-direction serving as a first direction, and the up-down direction in FIG. 3 is denoted as a Y-direction serving as a second direction. The X-direction and the Y-direction are parallel to one surface $1a$ of a base material 1 (refer to FIG. 9 to be discussed later). The term "parallel" means being formed approximately in parallel, and a slight deviation associated with manufacturing is allowed.

First Embodiment

Figure 2:
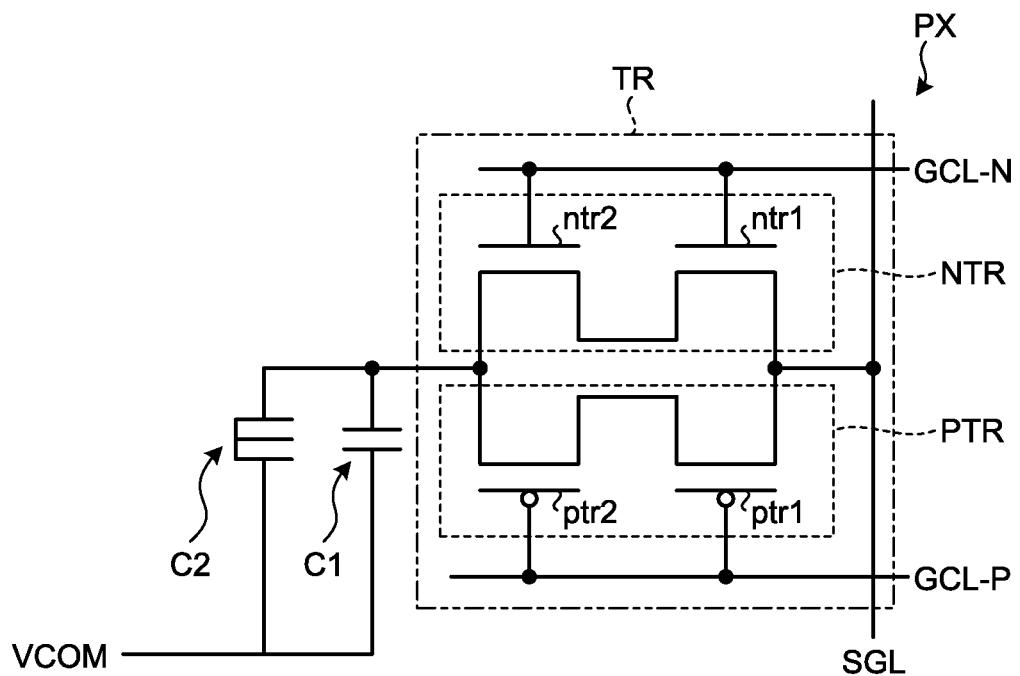
FIG. 2 is a circuit diagram illustrating a configuration example of one pixel on a TFT substrate according to the first embodiment.

FIG. 1 is a block diagram illustrating a configuration example of a display device according to a first embodiment of the present disclosure. FIG. 2 is a circuit diagram illustrating a configuration example of one pixel on a TFT substrate according to the first embodiment. A display device 200 according to the first embodiment is mounted on, for example, an electronic apparatus (not illustrated). A power supply voltage is applied from a power supply circuit of the electronic apparatus to the display device 200, which performs image display based on a signal output from a control circuit that is a host processor of the electronic apparatus. Examples of the display device 200 include, but are not limited to, an electrophoretic display (EPD) including an electrophoretic layer 160 (refer to FIG. 15 to be discussed later). As illustrated in FIG. 1, the display device 200 includes a TFT substrate 100, a gate driver 110 coupled to the TFT substrate 100, and a source driver 120 coupled to the TFT substrate 100.

As illustrated in FIG. 1, the TFT substrate 100 includes a plurality of pixels PX, a plurality of first gate lines GCL-N(n), GCL-N(n+1), GCL-N(n+2), . . . , a plurality of second gate lines GCL-P(n), GCL-P(n+1), GCL-P(n+2), . . . , and a plurality of signal lines SGL(m), SGL(m+1), SGL(m+2), . . . , where n and m are integers equal to or larger than 1. In the following description, the first gate lines GCL-N(n), GCL-N(n+1), GCL-N(n+2), . . . will each be called a first gate line GCL-N when they need not be distinguished from one another. In the same manner, the second gate lines GCL-P(n), GCL-P(n+1), GCL-P(n+2), . . . will each be called a second gate line GCL-P when they need not be distinguished from one another. The signal lines SGL(m), SGL(m+1), SGL(m+2), . . . will each be called a signal line SGL when they need not be distinguished from one another.

The pixels PX are arranged side by side in the X-direction and the Y-direction intersecting with the X-direction, and are arranged in a two-dimensional matrix having a row-column configuration. The first gate lines GCL-N extend in the X-direction, and are arranged side by side in the Y-direction. The second gate lines GCL-P also extend in the X-direction, and are arranged side by side in the Y-direction. The first gate lines GCL-N and the second gate lines GCL-P are alternately arranged side by side in the Y-direction. For example, the first gate lines GCL-N and the second gate lines GCL-P are arranged side by side in the Y-direction in the order of the first gate line GCL-N(n), the second gate line GCL-P(n), the first gate line GCL-N(n+1), the second gate line GCL-P(n+1), . . . . The signal lines SGL extend in the Y-direction, and are arranged side by side in the X-direction. With this arrangement, each of the signal lines SGL is orthogonal to the first gate lines GCL-N and the second gate lines GCL-P in a plan view. The plan view refers to a view from a direction normal to the one surface $1a$ of a base material 1 of the TFT substrate 100 (refer to FIG. 9 to be discussed later).

Each of the first gate lines GCL-N and the second gate lines GCL-P is coupled to the gate driver 110. Each of the signal lines SGL is coupled to the source driver 120.

The gate driver 110 generates a first gate drive signal and a second gate drive signal based on the signal output from the above-described control circuit. The gate driver 110 supplies the first gate drive signal to the first gate lines GCL-N, and supplies the second gate drive signal to the second gate lines GCL-P. The source driver 120 generates a source drive signal based on the signal output from the above-described control circuit. The source driver 120 supplies the source drive signal to the signal lines SGL.

Figure 15:
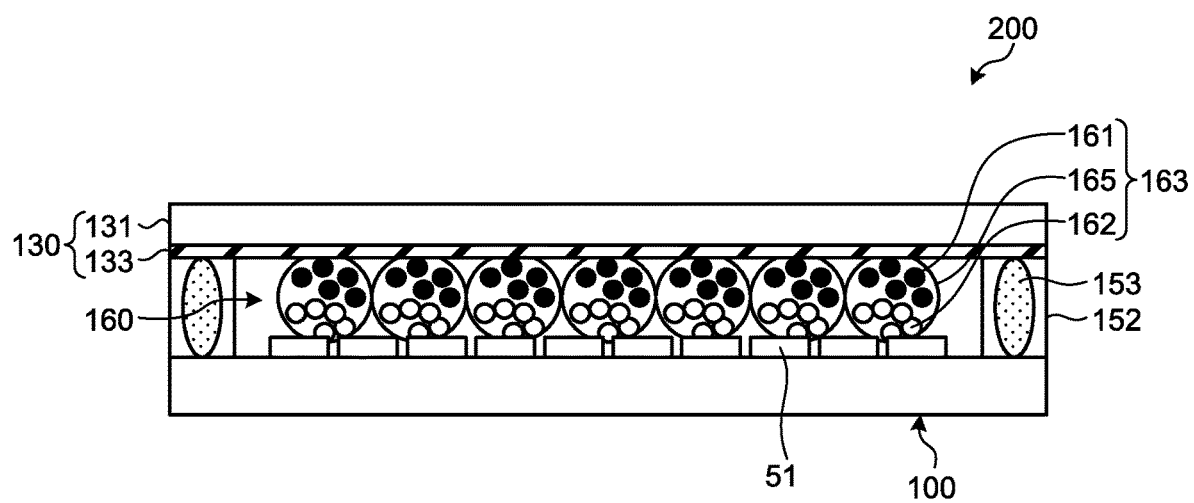
FIG. 15 is a sectional view illustrating a configuration example of the display device according to the first embodiment.

The gate driver 110 and the source driver 120 may be provided on the TFT substrate 100, or may be provided on a counter substrate 130 (refer to FIG. 15 to be discussed later). The gate driver 110 and the source driver 120 may be included in an integrated circuit (IC) mounted on another circuit substrate (such as a flexible substrate) coupled to the TFT substrate 100.

As illustrated in FIG. 2, each of the pixels PX of the TFT substrate 100 includes a pixel transistor TR. For example, the pixel transistor TR has a complementary metal-oxide semiconductor (MOS) (CMOS) configuration, and includes an n-channel metal-oxide semiconductor (NMOS) transistor NTR and a p-channel metal-oxide semiconductor (PMOS) transistor PTR. Each of the NMOS transistor NTR and the PMOS transistor PTR is, for example, a bottom-gate transistor.

The NMOS transistor NTR is coupled in parallel to the PMOS transistor PTR. The source of the NMOS transistor NTR and the source of the PMOS transistor PTR are coupled to the signal line SGL. The drain of the NMOS transistor NTR is coupled to the drain of the PMOS transistor PTR. In the first embodiment, the source of the NMOS transistor NTR and the source of the PMOS transistor PTR are configured as a common source 31s (refer to FIG. 9 to be discussed later). The drain of the NMOS transistor NTR and the drain of the PMOS transistor PTR are configured as a common drain 31d (refer to FIG. 6 to be discussed later).

The NMOS transistor NTR includes a first NMOS transistor ntr1 and a second NMOS transistor ntr2. The first NMOS transistor ntr1 is coupled in series to the second NMOS transistor ntr2. The PMOS transistor PTR includes a first PMOS transistor ptr1 and a second PMOS transistor ptr2. The first PMOS transistor ptr1 is coupled in series to the second PMOS transistor ptr2.

The gate of the NMOS transistor NTR includes a gate n1g of the first NMOS transistor ntr1 (refer to FIG. 9 to be discussed later) and a gate n2g of the second NMOS transistor ntr2 (refer to FIG. 9 to be discussed later). The gate of the NMOS transistor NTR is coupled to the first gate line GCL-N. The source of the NMOS transistor NTR is coupled to the signal line SGL. The drain of the NMOS transistor NTR is coupled to a pixel electrode 51 (refer to FIG. 9 to be discussed later). The source of the NMOS transistor NTR is supplied with the source drive signal (video signal) from the signal line SGL. The gate of the NMOS transistor NTR is supplied with the first gate drive signal from the first gate line GCL-N. When the voltage of the first gate drive signal supplied to the NMOS transistor NTR increases to a predetermined value or higher, the NMOS transistor NTR is turned on. As a result, the source drive signal (video signal) is supplied from the signal line SGL to the pixel electrode 51 through the NMOS transistor NTR.

The gate of the PMOS transistor PTR includes a gate of the first PMOS transistor ptr1 and a gate of the second PMOS transistor ptr2. The gate of the PMOS transistor PTR is coupled to the second gate line GCL-P. The source of the PMOS transistor PTR is coupled to the signal line SGL. The drain of the PMOS transistor PTR is coupled to the pixel electrode 51. The source of the PMOS transistor PTR is supplied with the source drive signal (video signal) from the signal line SGL. The gate of the PMOS transistor PTR is supplied with the second gate drive signal from the second gate line GCL-P. When the voltage of the second gate drive signal supplied to the PMOS transistor PTR decreases to a predetermined value or lower, the PMOS transistor PTR is turned on. As a result, the source drive signal (video signal) is supplied from the signal line SGL to the pixel electrode 51 through the PMOS transistor PTR.

Each of the pixels PX of the TFT substrate 100 has first retention capacitance C1 and second retention capacitance C2. The first retention capacitance C1 is generated between the pixel electrode 51 and a common electrode 41 (refer to FIG. 9 to be discussed later). The second retention capacitance C2 is generated between a counter electrode 133 (refer to FIG. 15 to be discussed later) of the counter substrate 130 and the pixel electrode 51. The pixel electrode 51 is supplied with the source drive signal (video signal) from the signal line SGL through the pixel transistor TR. The common electrode 41 and the counter electrode 133 are supplied with a common potential VCOM. The potential of the source drive signal (video signal) supplied to the pixel electrode 51 is retained by the first retention capacitance C1 and the second retention capacitance C2.

Figure 4:
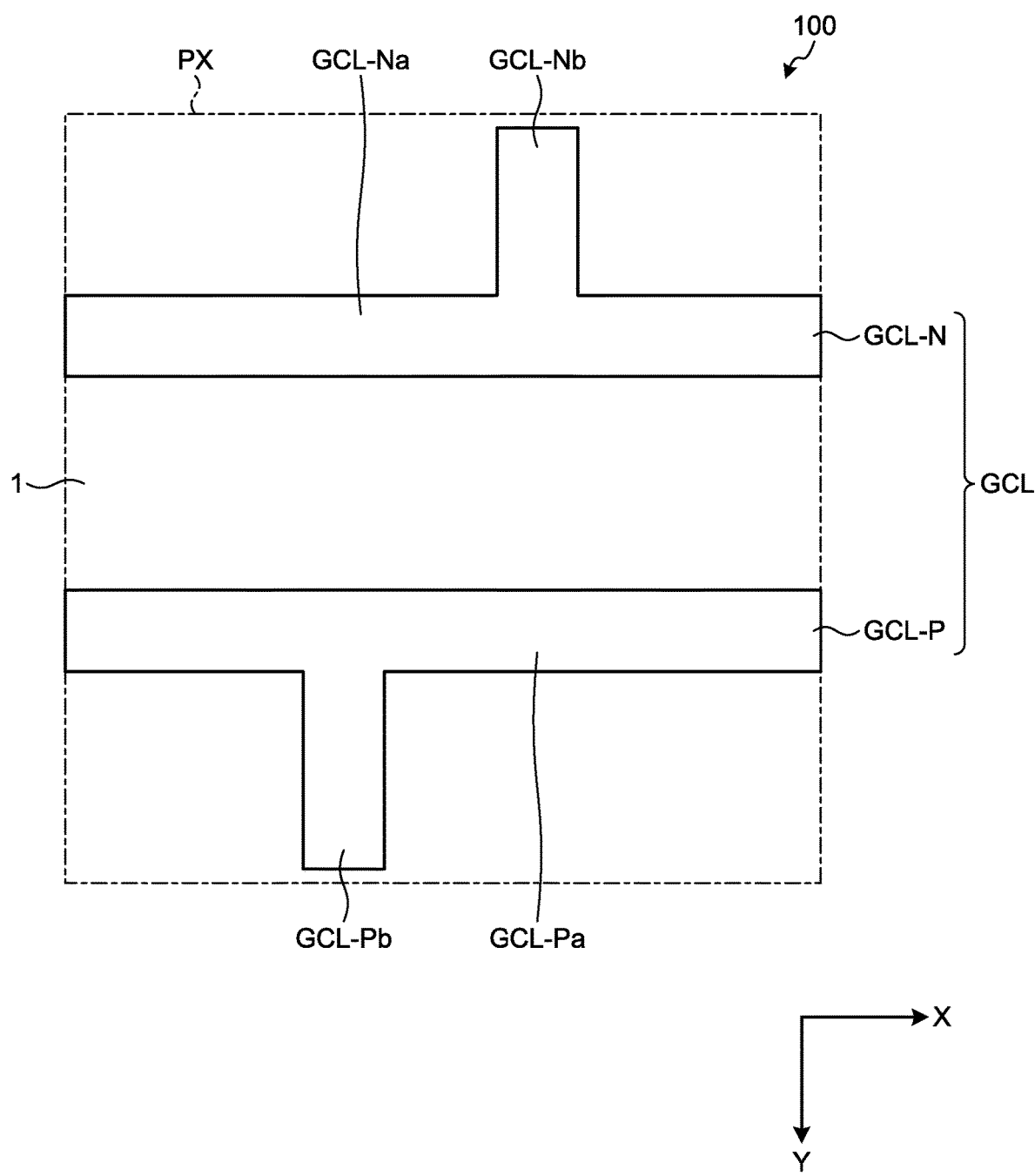
FIG. 4 is a plan view illustrating a configuration example of a gate line in one of the pixels of the TFT substrate according to the first embodiment.
Figure 5:
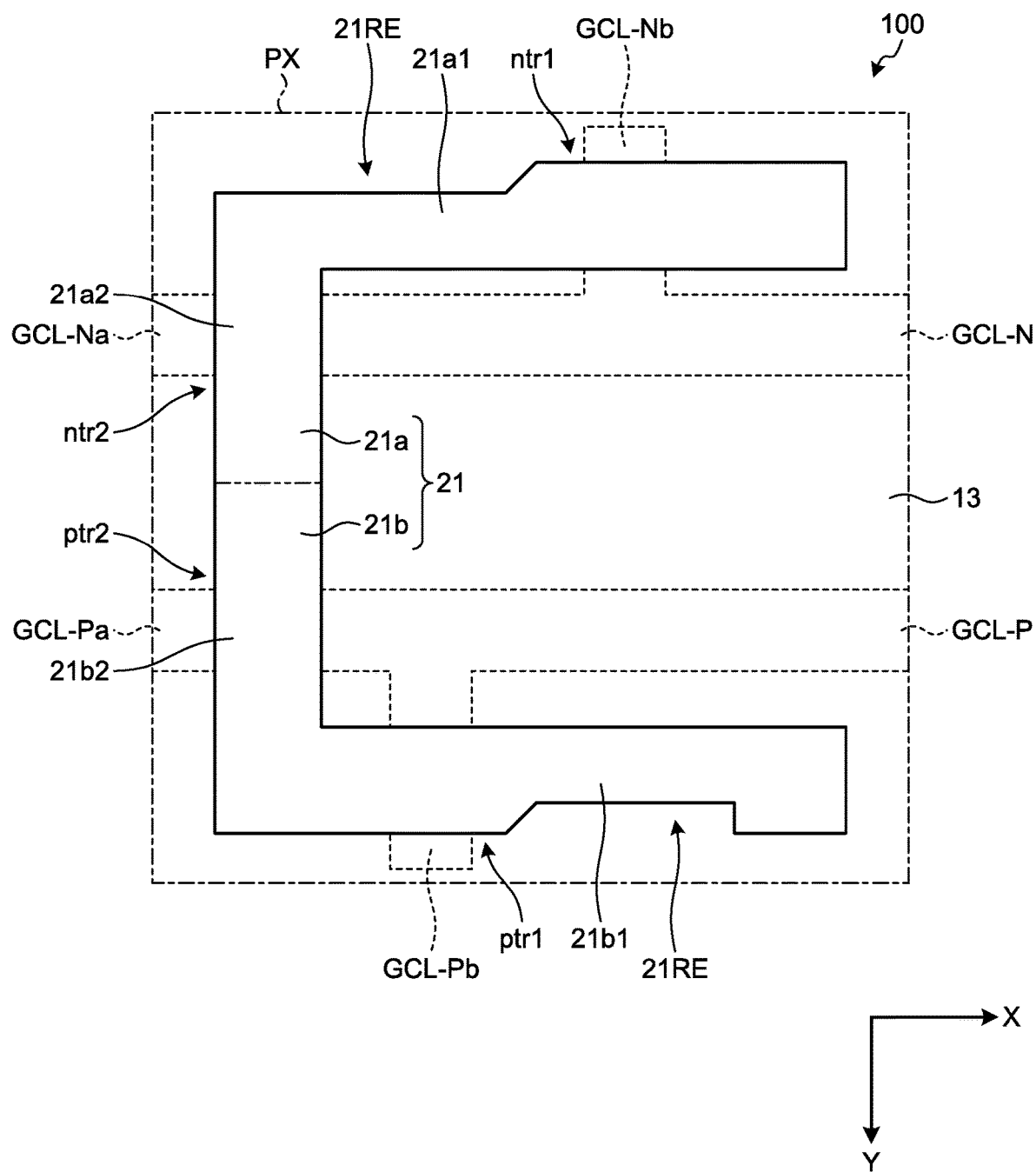
FIG. 5 is a plan view illustrating a configuration example of a semiconductor film in one of the pixels of the TFT substrate according to the first embodiment.
Figure 6:
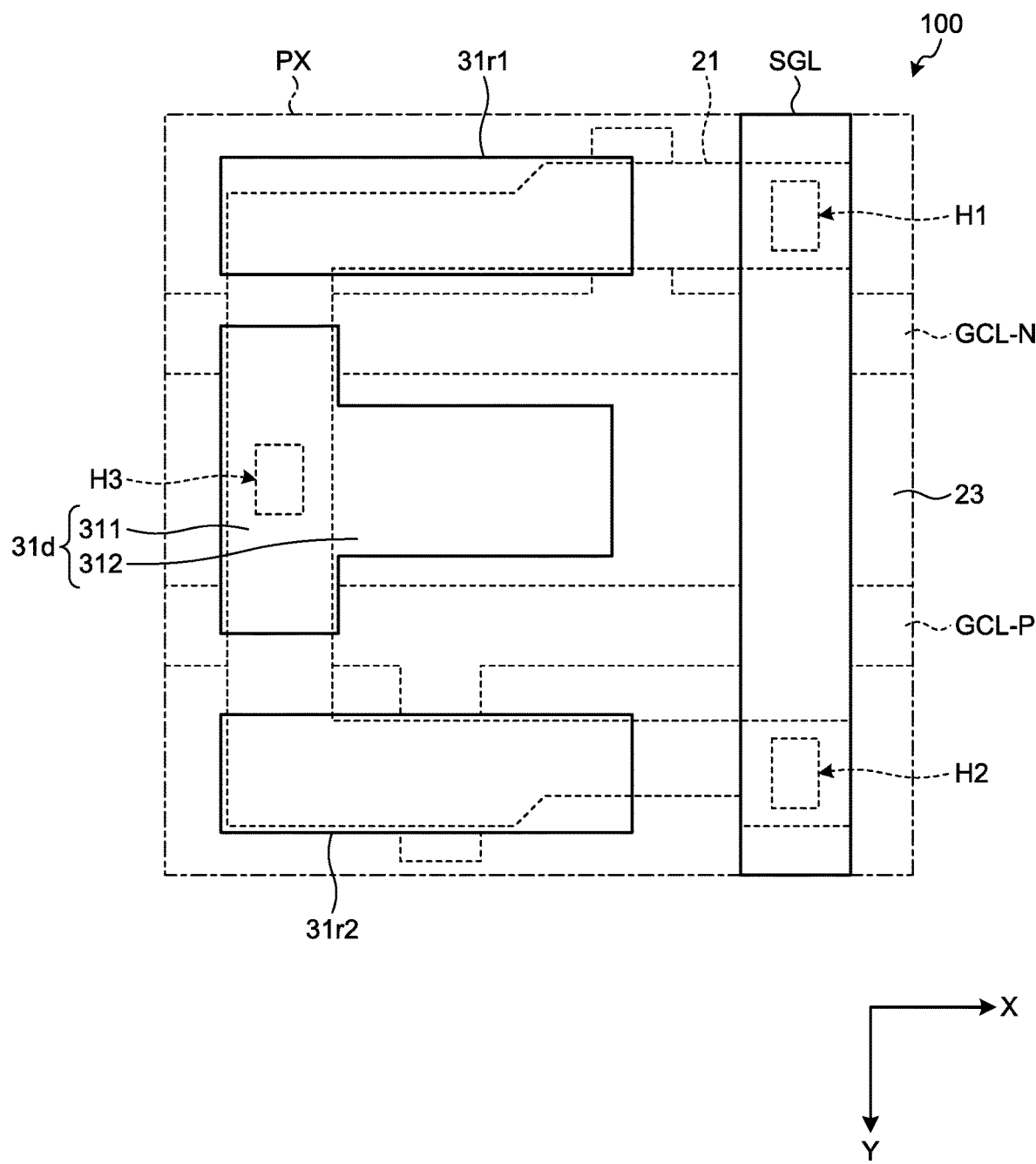
FIG. 6 is a plan view illustrating a configuration example of a signal line, a drain, and light-blocking films in one of the pixels of the TFT substrate according to the first embodiment.
Figure 7:
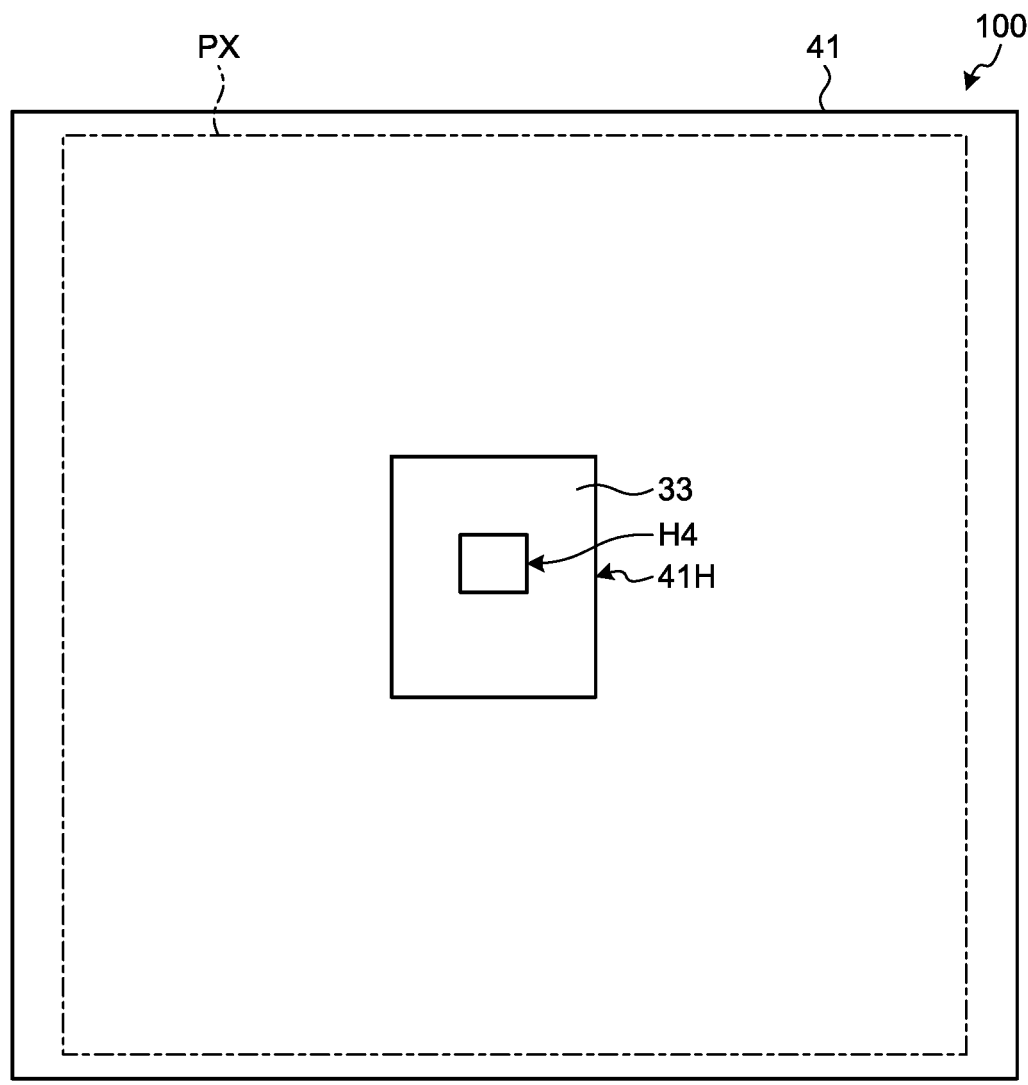
FIG. 7 is a plan view illustrating a configuration example of a common electrode in one of the pixels of the TFT substrate.
Figure 8:
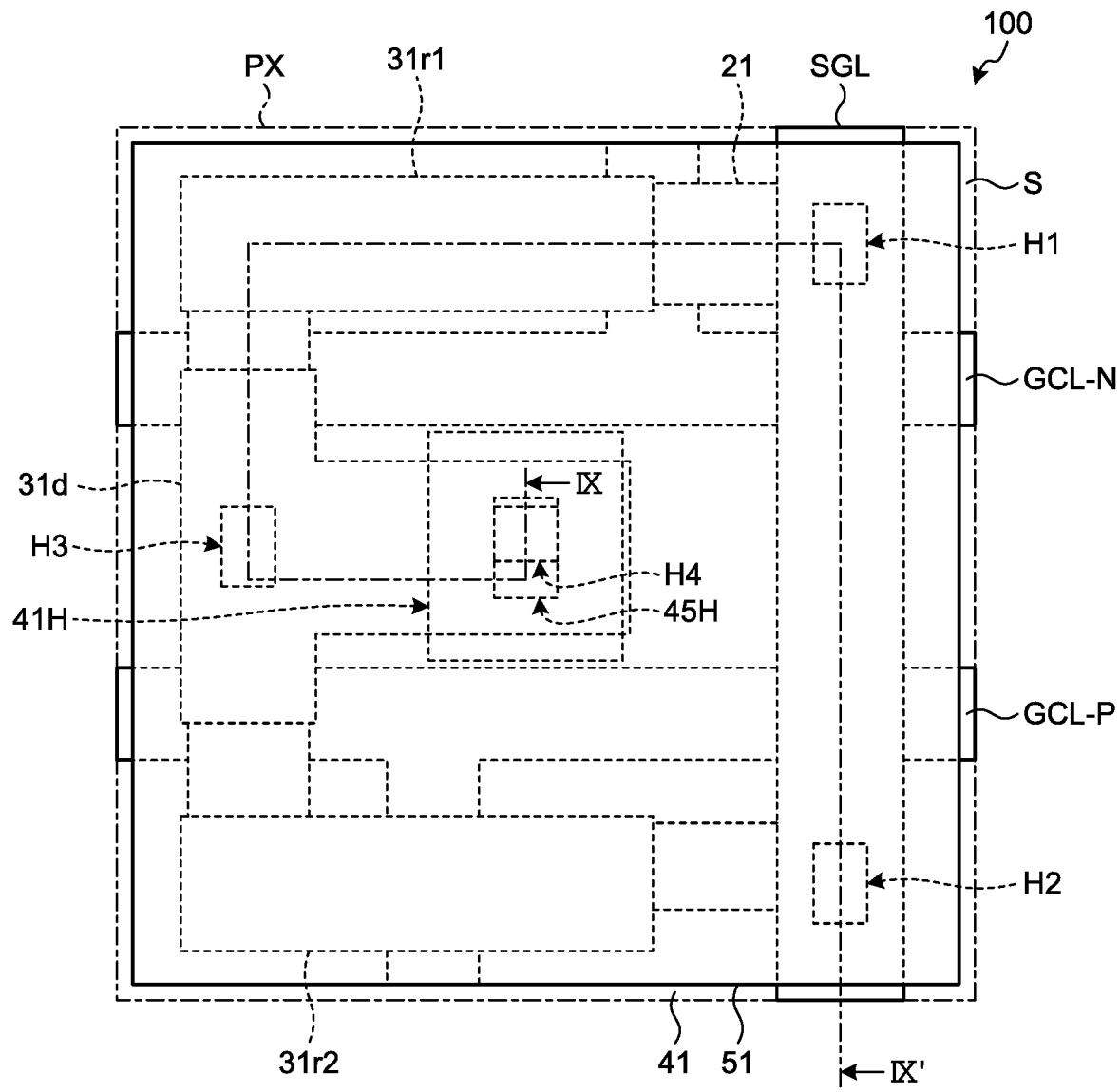
FIG. 8 is a plan view illustrating a configuration example of one of the pixels of the TFT substrate according to the first embodiment.

The following describes the structure of the TFT substrate. FIG. 3 is a plan view illustrating an arrangement example of the pixels on the TFT substrate according to the first embodiment. FIG. 4 is a plan view illustrating a configuration example of a gate line in one of the pixels of the TFT substrate according to the first embodiment. FIG. 5 is a plan view illustrating a configuration example of a semiconductor film in one of the pixels of the TFT substrate according to the first embodiment. FIG. 5 illustrates portions covered with an insulating film 13 with dashed lines. FIG. 6 is a plan view illustrating a configuration example of the signal line, the drain, and light-blocking films in one of the pixels of the TFT substrate according to the first embodiment. FIG. 6 illustrates portions covered with an interlayer insulating film 23 with dashed lines. FIG. 7 is a plan view illustrating a configuration example of the common electrode in one of the pixels of the TFT substrate. FIG. 8 is a plan view illustrating a configuration example of one of the pixels of the TFT substrate according to the first embodiment. FIG. 8 illustrates portions covered with the pixel electrode 51 with dashed lines. To avoid complexity of the drawing, FIG. 8 does not illustrate a planarizing film 33, the interlayer insulating film 23, and the insulating film 13 illustrated in FIG. 9. FIG. 9 is a sectional view obtained by cutting the plan view illustrated in FIG. 8 along line IX-IX'.

Figure 9:
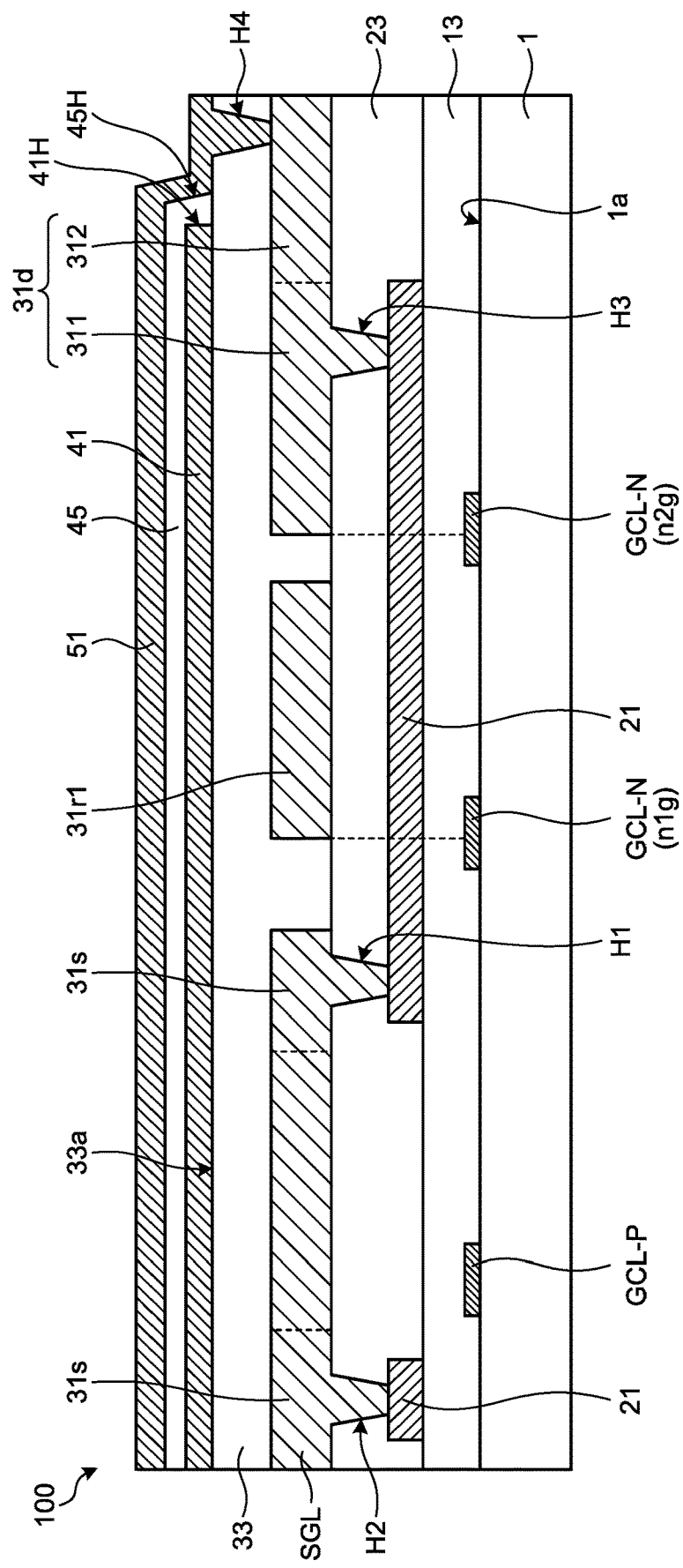
FIG. 9 is a sectional view obtained by cutting the plan view illustrated in FIG. 8 along line IX-IX'.

As illustrated in FIGS. 3, 4, and 9, the TFT substrate 100 includes the base material 1, a gate line GCL provided on the one surface 1a of the base material 1, and the insulating film 13 provided on the one surface 1a of the base material 1. The gate line GCL includes the first gate line GCL-N and the second gate line GCL-P adjacent to the first gate line GCL-N in the Y-direction. The insulating film 13 covers the first gate line GCL-N and the second gate line GCL-P. A portion of the insulating film 13 interposed between the first gate line GCL-N or the second gate line GCL-P and a semiconductor film 21 serves as a gate insulating film.

As illustrated in FIG. 4, the first gate line GCL-N includes a first gate main line GCL-Na and a first gate sub-line GCL-Nb coupled to the first gate main line GCL-Na. The first gate main line GCL-Na extends in the X-direction. The first gate main line GCL-Na is provided so as to be continuous between the pixels PX. The first gate sub-line GCL-Nb projects in the Y-direction from the first gate main line GCL-Na. One end of the first gate sub-line GCL-Nb is coupled to the first gate main line GCL-Na, and the other end thereof is not coupled to any part. The first gate sub-line GCL-Nb is provided in each of the pixels PX one by one.

As illustrated in FIG. 4, the second gate line GCL-P includes a second gate main line GCL-Pa and a second gate sub-line GCL-Pb coupled to the second gate main line GCL-Pa. The second gate main line GCL-Pa extends in the X-direction. The second gate main line GCL-Pa is provided so as to be continuous between the pixels PX. The second gate sub-line GCL-Pb projects in the Y-direction from the second gate main line GCL-Pa. One end of the second gate sub-line GCL-Pb is coupled to the second gate main line GCL-Pa, and the other end thereof is not coupled to any part. The second gate sub-line GCL-Pb is provided in each of the pixels PX one by one.

As illustrated in FIGS. 3, 5, and 9, the TFT substrate 100 includes the semiconductor film 21 provided on the insulating film 13 and the interlayer insulating film 23 provided on the insulating film 13. The interlayer insulating film 23 covers the semiconductor film 21. The interlayer insulating film 23 is provided with contact holes H1, H2, and H3. The contact holes H1, H2, and H3 are through-holes of the interlayer insulating film 23, and the surface of the semiconductor film 21 is exposed from the bottom of the contact holes H1, H2, and H3.

As illustrated in FIG. 5, the semiconductor film 21 has a first portion 21a and a second portion 21b coupled to the first portion 21a. The first portion 21a intersects with the first gate main line GCL-Na and the first gate sub-line GCL-Nb in the plan view. The second portion 21b intersects with the second gate main line GCL-Pa and the second gate sub-line GCL-Pb in the plan view.

For example, the first portion 21a has a linear portion 21a1 that extends in the X-direction and intersects with the first gate sub-line GCL-Nb in the plan view, and has a linear portion 21a2 that extends in the Y-direction and intersects with the first gate main line GCL-Na in the plan view. An end in the X-direction of the linear portion 21a1 and an end in the Y-direction of the linear portion 21a2 are coupled to each other. The linear portion 21a1 and the linear portion 21a2 form an angle of about 90 degrees. As a result, the first portion 21a is L-shaped in the plan view.

The second portion 21b has a linear portion 21b1 that extends in the X-direction and intersects with the second gate sub-line GCL-Pb in the plan view, and has a linear portion 21b2 that extends in the Y-direction and intersects with the second gate main line GCL-Pa in the plan view. An end in the X-direction of the linear portion 21b1 and an end in the Y-direction of the linear portion 21b2 are coupled to each other. The linear portion 21b1 and the linear portion 21b2 form an angle of about 90 degrees. As a result, the second portion 21b is L-shaped in the plan view.

Portions of the first gate line GCL-N intersecting with the first portion 21a of the semiconductor film 21 in the plan view serve as the gates of the NMOS transistor NTR. For example, a region of the first gate sub-line GCL-Nb intersecting with the linear portion 21a1 of the first portion 21a in the plan view serves as the gate n1g of the first NMOS transistor ntr1. A region of the first gate main line GCL-Na intersecting with the linear portion 21a2 of the first portion 21a in the plan view serves as the gate n2g of the second NMOS transistor ntr2.

In the same way, portions of the second gate line GCL-P intersecting with the second portion 21b of the semiconductor film 21 in the plan view serve as the gates of the PMOS transistor PTR. For example, a region of the second gate sub-line GCL-Pb intersecting with the linear portion 21b1 of the second portion 21b in the plan view serves as the gate of the first PMOS transistor ptr1. A region of the second gate main line GCL-Pa intersecting with the linear portion 21b2 of the second portion 21b in the plan view serves as the gate of the second PMOS transistor ptr2.

As illustrated in FIG. 6, the first portion 21a of the semiconductor film 21 is coupled to the signal line SGL through the contact hole H1. The second portion 21b of the semiconductor film 21 is coupled to the signal line SGL through the contact hole H2.

As illustrated in FIGS. 6 and 9, the TFT substrate 100 also includes the signal line SGL, the source 31s and the drain 31d of the pixel transistor TR (refer to FIG. 2), and light-blocking films 31r1 and 31r2. The signal line SGL, the source 31s and the drain 31d, and the light-blocking films 31r1 and 31r2 are provided on the interlayer insulating film 23. That is, the signal line SGL, the source 31s and the drain 31d, and the light-blocking films 31r1 and 31r2 are provided in the same layer.

A portion of the signal line SGL with the contact hole H1 buried therein and the periphery thereof, and a portion of the signal line SGL with the contact hole H2 buried therein and the periphery thereof serve as the source 31s of the pixel transistor TR. The drain 31d is disposed at a location away from the signal line SGL, and has the contact hole H3 buried therein. The signal line SGL, the source 31s and the drain 31d, and the light-blocking films 31r1 and 31r2 are made of, for example, conductive films having the same composition. The source 31s can be called a source electrode. The drain 31d can be called a drain electrode.

As illustrated in FIG. 6, the light-blocking films 31r1 and 31r2 have, for example, the same shape and the same size in the plan view. The shape in the plan view of the light-blocking films 31r1 and 31r2 is, for example, a rectangle. The light-blocking film 31r1 extends in the X-direction, and overlaps with the semiconductor film 21 in the plan view. As illustrated in FIGS. 6 and 9, the light-blocking film 31r1 overlaps with the drain side of the gate n1g of the first NMOS transistor ntr1 (refer to FIG. 5) in the plan view. The light-blocking film 31r2 extends in the X-direction, and overlaps with the semiconductor film 21 in the plan view. The light-blocking film 31r2 overlaps with the whole region of the gate of the first PMOS transistor ptr1 (refer to FIG. 5) in the plan view.

As illustrated in FIG. 6, the shape in the plan view of the drain 31d is, for example, a T-shape. The drain 31d has a linear portion 311 extending in the Y-direction and a linear portion 312 extending in the X-direction. An end in the X-direction of the linear portion 312 is coupled to a central portion in the Y-direction of the linear portion 311. The linear portion 311 and the linear portion 312 form an angle of about 90 degrees. The linear portion 311 overlaps with the drain side of the gate n2g of the second NMOS transistor ntr2 (refer to FIG. 5) and the drain side of the gate of the second PMOS transistor ptr2 (refer to FIG. 5) in the plan view.

As illustrated in FIG. 9, the TFT substrate 100 also includes the insulating planarizing film 33 provided on the interlayer insulating film 23. The planarizing film 33 covers the signal line SGL. An upper surface 33a of the planarizing film 33 is flat and parallel to the one surface 1a of the base material 1. The planarizing film 33 is provided with a contact hole H4. The contact hole H4 is a through-hole of the planarizing film 33, and the surface of the drain 31d of the pixel transistor TR (refer to FIG. 2) is exposed from the bottom of the contact hole H4.

As illustrated in FIG. 9, the TFT substrate 100 also includes the common electrode 41 provided on the planarizing film 33 and an insulating film 45 provided on the common electrode 41. As illustrated in FIG. 7, the common electrode 41 is provided with one through-hole 41H for one of the pixels PX. The through-hole 41H surrounds the contact hole H4 provided in the planarizing film 33 in the plan view.

The insulating film 45 covers the common electrode 41. The insulating film 45 serves as a dielectric material of the first retention capacitance C1 (refer to FIG. 2). The insulating film 45 covers the internal surfaces of the through-hole 41H. The insulating film 45 is provided with a through-hole 45H. The contact hole H4 is located at the bottom of the through-hole 45H.

As illustrated in FIGS. 8 and 9, the TFT substrate 100 also includes the pixel electrode 51 provided on the insulating film 45. The pixel electrode 51 covers the common electrode 41 with the insulating film 45 interposed therebetween. The pixel electrode 51 flows into the inside of the through-hole 45H and the inside of the contact hole H4, and fills the inside of the through-hole 45H and the inside of the contact hole H4. Thus, the pixel electrode 51 is coupled to the drain 31d of the pixel transistor TR.

The shape in the plan view of the pixel electrode 51 is, for example, a rectangle. On the TFT substrate 100, a plurality of the pixel electrodes 51 are arranged side by side in the X-direction and the Y-direction intersecting with the X-direction, and are arranged in a two-dimensional matrix having a row-column configuration.

In the present embodiment, an area overlapping with each of the pixel electrodes 51 in the plan view serves as one of the pixels PX. More specifically, a space S (refer to FIG. 8) is present between the pixel electrodes 51 adjacent to each other in the plan view. A center line (indicated by a long dashed short dashed line in FIG. 8) passing through the space S and equidistant from the adjacent pixel electrodes 51 defines each of the pixels PX. This center line is an imaginary line, and not an actually visible line.

Figure 10:
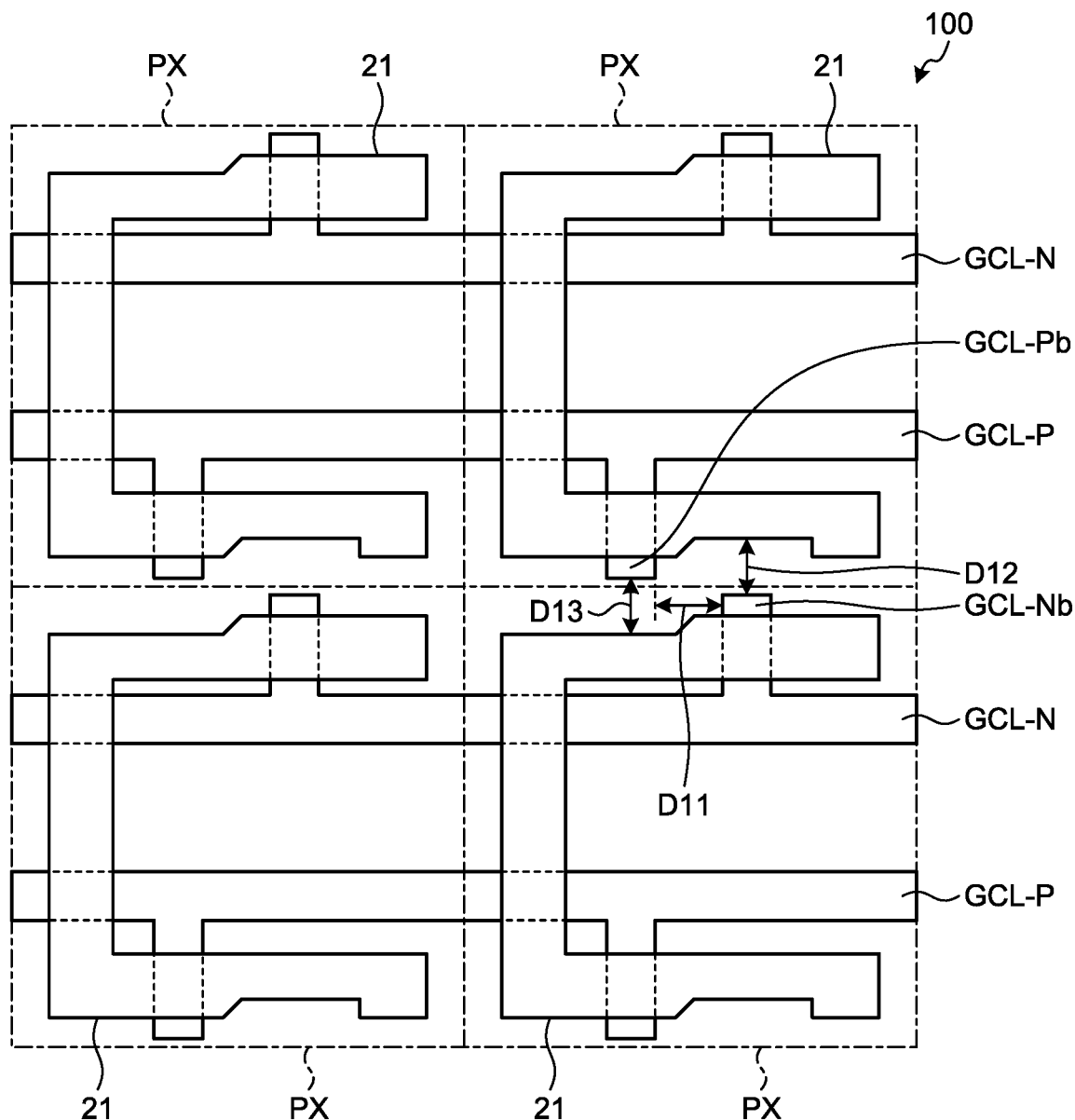
FIG. 10 is a plan view illustrating relations among the gate lines and the semiconductor films between adjacent pixels on the TFT substrate according to the first embodiment.

FIG. 10 is a plan view illustrating relations among the gate lines and the semiconductor films between adjacent pixels on the TFT substrate according to the first embodiment. As illustrated in FIGS. 4 and 10, in the TFT substrate 100 according to the first embodiment, the first gate sub-line GCL-Nb and the second gate sub-line GCL-Pb are arranged so as to be displaced from each other in the X-direction. This arrangement can prevent the first gate sub-line GCL-Nb and the second gate sub-line GCL-Pb from facing each other between the pixels PX adjacent in the Y-direction, as illustrated in FIG. 10. Even without widening a space between the pixels PX adjacent in the Y-direction, the TFT substrate 100 can ensure a larger separation distance D11 in the X-direction between the first gate sub-line GCL-Nb of one of the pixels PX and the second gate sub-line GCL-Pb of the other of the pixels PX. With this configuration, the TFT substrate 100 can prevent the gate lines GCL from affecting each other between the pixels PX adjacent in the Y-direction.

As illustrated in FIG. 10, the TFT substrate 10 also includes the pixels PX arranged side by side in the X-direction and the Y-direction. The semiconductor film 21, the first gate sub-line GCL-Nb, and the second gate sub-line GCL-Pb are disposed in each of the pixels PX. As illustrated in FIGS. 5 and 10, the semiconductor film 21 has recesses 21RE facing outward from the pixel PX in the plan view. Between the pixels PX adjacent in the Y-direction, one of the recesses 21RE of one of the pixels PX faces the first gate sub-line GCL-Nb or the second gate sub-line GCL-Pb of the other of the pixels PX. With this configuration, as illustrated in FIG. 10, the TFT substrate 100 can ensure a larger distance D12 between the semiconductor film 21 and the first gate sub-line GCL-Nb and a larger distance D13 between the semiconductor film 21 and the second gate sub-line GCL-Pb without widening the space between the pixels PX adjacent in the Y-direction. Thus, the TFT substrate 100 can prevent the semiconductor film 21 and the gate line GCL from affecting each other between the pixels PX adjacent in the Y-direction.

The following exemplifies materials constituting portions of the TFT substrate 100. The base material 1 is made of glass or a flexible resin substrate. The first gate line GCL-N and the second gate line GCL-P are made of a material containing molybdenum. The insulating film 13 is an inorganic insulating film constituted by a silicon oxide film and a silicon nitride film. The insulating film 13 is constituted by, for example, a multilayered structure film obtained by stacking a silicon oxide film and a silicon nitride film in this order from the base material 1 side. The semiconductor film 21 is constituted by a polysilicon film. The semiconductor film 21 is not limited to being constituted by the polysilicon film, and may be constituted by an amorphous film or an oxide semiconductor film. The interlayer insulating film 23 is an inorganic insulating film constituted by a silicon oxide film and a silicon nitride film. The interlayer insulating film 23 is constituted by, for example, a multilayered structure film obtained by stacking a silicon oxide film, a silicon nitride film, and another silicon oxide film in this order from the base material 1 side.

The signal line SGL (including the source 31s), the drain 31d, and the light-blocking films 31r1 and 31r2 are made of titanium and aluminum. The signal line SGL, the drain 31d, and the light-blocking films 31r1 and 31r2 are each constituted by, for example, a multilayered structure film obtained by stacking titanium, aluminum, and titanium in this order from the base material 1 side. The planarizing film 33 is an organic insulating film made of an acrylic resin. The common electrode 41 is made of indium tin oxide (ITO) to serve as a light-transmitting conductive film. The insulating film 45 is an inorganic insulating film constituted by a silicon nitride film. The pixel electrode 51 is made of ITO.

The above-mentioned materials are mere examples. In the present embodiment, the portions of the TFT substrate 100 may be made of materials other than those mentioned above. For example, the first gate line GCL-N and the second gate line GCL-P may each be constituted by a film of aluminum, copper, silver, molybdenum, or an alloy thereof. The signal line SGL, the drain 31d, and the light-blocking films 31r1 and 31r2 may be made of titanium aluminum, which is a titanium-aluminum alloy.

The following describes a manufacturing method of the TFT substrate 100 according to the first embodiment with reference to sectional views and plan views. FIGS. 11 to 14 are the sectional views for explaining the manufacturing method of the TFT substrate. FIGS. 11 to 14 correspond to the sectional view illustrated in FIG. 9, and illustrate a manufacturing process in the sectional view.

Figure 11:
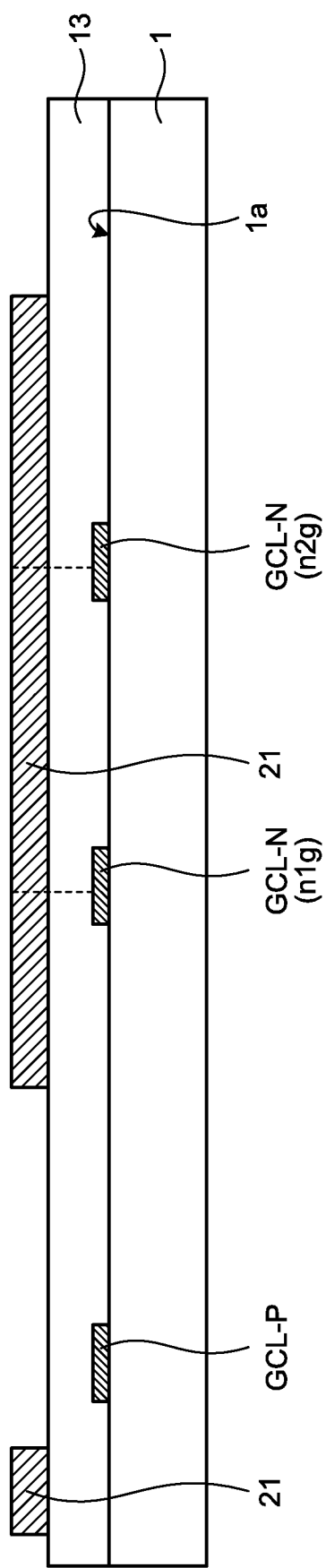
FIG. 11 is a sectional view for explaining a manufacturing method of the TFT substrate.

As illustrated in FIG. 11, manufacturing equipment (not illustrated) first forms a conductive film (not illustrated) of, for example, molybdenum on the base material 1. The conductive film is formed using, for example, a sputtering method. The manufacturing equipment then patterns the conductive film using a photolithography technique and a dry etching technique to form the first gate line GCL-N and the second gate line GCL-P. For example, the manufacturing equipment forms a resist (not illustrated) on the conductive film. The resist is patterned by the photolithography to be formed into a shape that covers an area in which the first gate line GCL-N and the second gate line GCL-P are to be formed and that exposes the other areas. The manufacturing equipment then uses the dry etching technique to remove the conductive film in the area exposed from the resist. This process forms the first gate line GCL-N and the second gate line GCL-P from the conductive film. After forming the first gate line GCL-N and the second gate line GCL-P, the manufacturing equipment removes the resist.

The manufacturing equipment then forms the insulating film 13 on the base material 1. The insulating film 13 is formed using, for example, a chemical vapor deposition (CVD) method. This process covers the first gate line GCL-N and the second gate line GCL-P with the insulating film 13. The manufacturing equipment then forms the semiconductor film on the insulating film 13. The semiconductor film is formed using, for example, the CVD method. The manufacturing equipment then patterns the semiconductor film using the photolithography technique and the dry etching technique. Thus, the manufacturing equipment forms the semiconductor film 21 having the shape illustrated in FIG. 5. After forming the semiconductor film 21, the manufacturing equipment removes the resist.

In the TFT substrate 100, one of two portions of the first gate line GCL-N overlapping with the semiconductor film 21 in the plan view serves as the gate n1g of the first NMOS transistor ntr1, and the other of the two portions serves as the gate n2g of the second NMOS transistor ntr2. Also, one of two portions of the second gate line GCL-P overlapping with the semiconductor film 21 in the plan view serves as the gate of the first PMOS transistor ptr1, and the other of the two portions serves as the gate of the second PMOS transistor ptr2.

Figure 12:
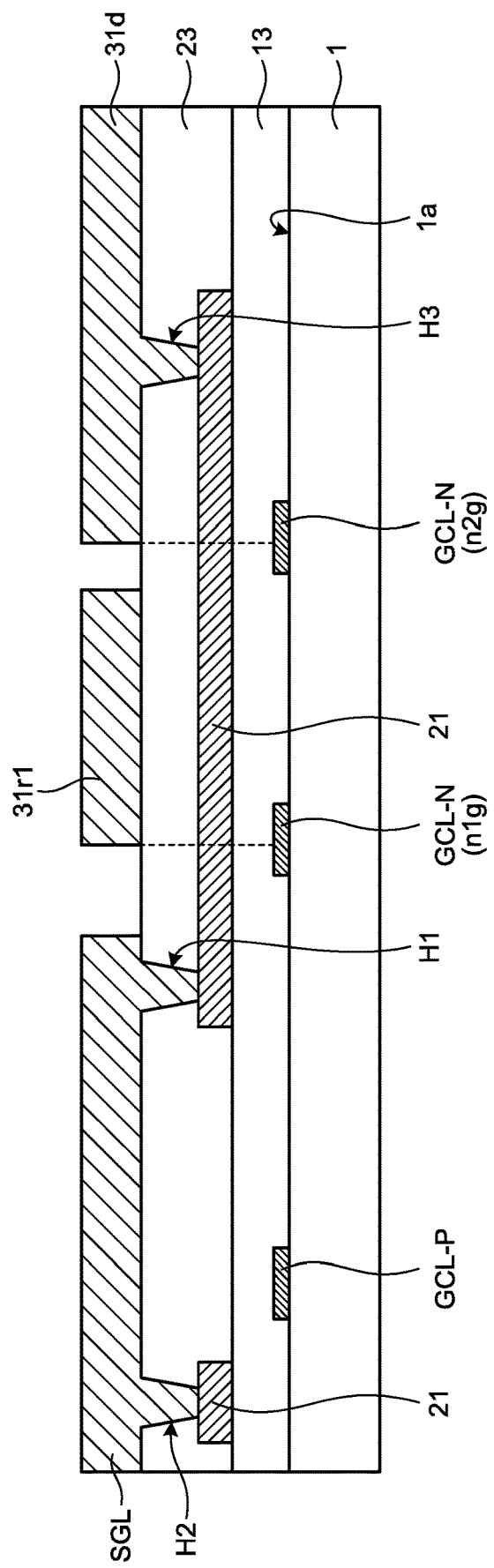
FIG. 12 is another sectional view for explaining the manufacturing method of the TFT substrate.

Then, as illustrated in FIG. 12, the manufacturing equipment forms the interlayer insulating film 23 on the insulating film 13. The interlayer insulating film 23 is formed using, for example, the CVD method. This process covers the semiconductor film 21 with the interlayer insulating film 23.

The manufacturing equipment then forms the contact holes H1, H2, and H3 in the interlayer insulating film 23. For example, the manufacturing equipment forms a resist (not illustrated) on the interlayer insulating film 23. The resist is patterned by the photolithography to be formed into a shape that exposes areas in which the contact holes H1, H2, and H3 are to be formed and that covers the other areas. The manufacturing equipment then uses the dry etching technique to remove the interlayer insulating film 23 in the areas exposed from the resist. This process forms the contact holes H1, H2, and H3 in the interlayer insulating film 23. After forming the contact holes H1, H2, and H3, the manufacturing equipment removes the resist.

The manufacturing equipment then forms the signal line SGL (including the source 31s illustrated in FIG. 9), the drain 31d, and the light-blocking films 31r1 and 31r2 (refer to FIG. 6) on the interlayer insulating film 23. For example, the manufacturing equipment forms a titanium film, then an aluminum film, and then another titanium film as a metal film on the interlayer insulating film 23. The metal film is formed using, for example, the sputtering method. The manufacturing equipment then patterns the metal film using the photolithography technique and the dry etching technique. Thus, the manufacturing equipment forms the signal line SGL coupled to the semiconductor film 21 through the contact holes H1 and H2, the drain 31d coupled to the semiconductor film 21 through the contact hole H3, and the light-blocking films 31r1 and 31r2. The manufacturing equipment then removes the resist.

Figure 13:
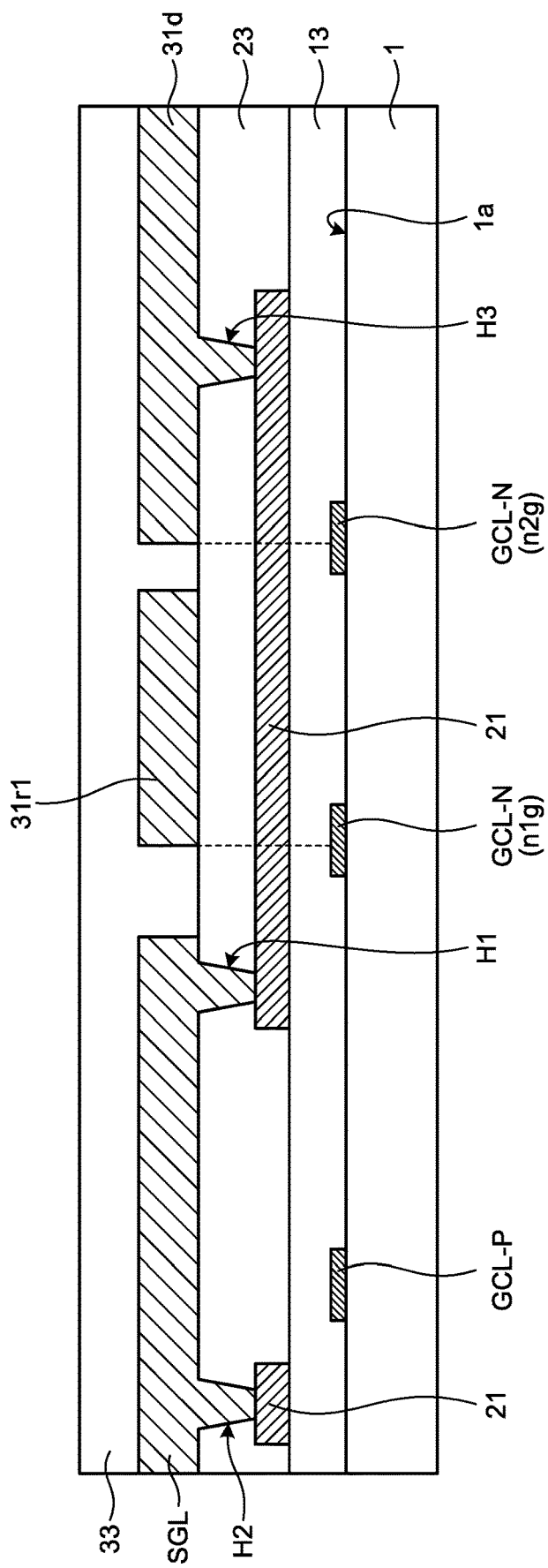
FIG. 13 is still another sectional view for explaining the manufacturing method of the TFT substrate.

Then, as illustrated in FIG. 13, the manufacturing equipment forms the planarizing film 33 on the interlayer insulating film 23. The planarizing film 33 has an insulating property, and is, for example, an organic material, such as an acrylic resin. The planarizing film 33 is formed using, for example, a slit coat method or a spin coating method. This process covers the signal line SGL, the drain 31d, and the light-blocking films 31r1 and 31r2 with the planarizing film 33. Using the organic material, such as the acrylic resin, for the planarizing film 33 can increase the film thickness of the planarizing film 33. This increase in the film thickness can reduce parasitic capacitance between the common electrode 41 and the signal line SGL, and parasitic capacitance between the common electrode 41 and the drain 31d.

Figure 14:
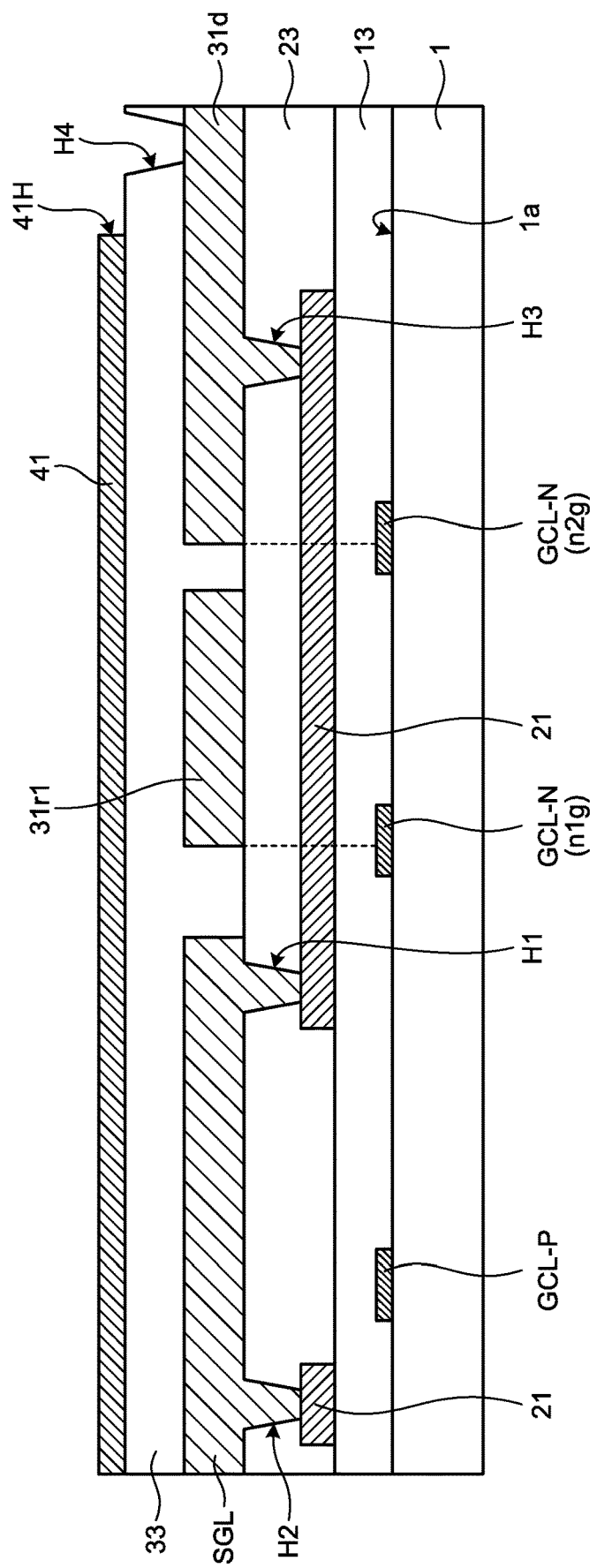
FIG. 14 is still another sectional view for explaining the manufacturing method of the TFT substrate.

Then, as illustrated in FIG. 14, the manufacturing equipment forms the common electrode 41 on the planarizing film 33. For example, the manufacturing equipment forms a conductive film of, for example, ITO on the planarizing film 33. The conductive film is formed using, for example, the sputtering method. The manufacturing equipment then patterns the conductive film using the photolithography technique and the dry etching technique. Thus, the manufacturing equipment forms the common electrode 41 having the through-hole 41H. After forming the common electrode 41, the manufacturing equipment removes the resist.

The manufacturing equipment then forms the contact hole H4 in the planarizing film 33. For example, the manufacturing equipment forms a resist (not illustrated) on the planarizing film 33. The resist covers the common electrode 41. The resist is patterned by the photolithography to be formed into a shape that exposes an area in which the contact hole H4 is to be formed and that covers the other areas. The area in which the contact hole H4 is to be formed is located inside the through-hole 41H in the plan view. The manufacturing equipment then uses the dry etching technique to remove the planarizing film 33 in the area exposed from the resist. This process forms the contact hole H4 in the planarizing film 33. After forming the contact hole H4, the manufacturing equipment removes the resist.

The manufacturing equipment then forms the insulating film 45 (refer to FIG. 9) above the base material 1. The insulating film 45 is formed using, for example, the CVD method. This process covers the common electrode 41 with the insulating film 45. This process also covers the internal surface and the bottom of the contact hole H4 with the insulating film 45. The manufacturing equipment then removes a portion of the insulating film 45 covering the bottom of the contact hole H4. For example, the manufacturing equipment forms a resist (not illustrated) on the insulating film 45. The resist is patterned by the photolithography to be formed into a shape that exposes an area overlapping with the bottom of the contact hole H4 in the plan view and that covers the other areas. The manufacturing equipment then uses the dry etching technique to remove the insulating film 45 in the area exposed from the resist. This process exposes the bottom of the contact hole H4 from the insulating film 45. The manufacturing equipment then removes the resist.

The manufacturing equipment then forms the pixel electrode 51 (refer to FIG. 9) on the insulating film 45. For example, the manufacturing equipment forms a conductive film of, for example, ITO on the insulating film 45. The conductive film is formed using, for example, the sputtering method. The manufacturing equipment then patterns the conductive film using the photolithography technique and the dry etching technique. Thus, the manufacturing equipment forms the pixel electrode 51 coupled to the drain 31*d* through the contact hole H4. After forming the pixel electrode 51, the manufacturing equipment removes the resist. The TFT substrate 100 according to the first embodiment is completed through the processes described above.

The following describes the structure of the display device 200 according to the first embodiment. FIG. 15 is a sectional view illustrating a configuration example of the display device 200 according to the first embodiment. As illustrated in FIG. 15, the display device 200 according to the first embodiment includes the above-described TFT substrate 100, the counter substrate 130 disposed so as to be opposed to the TFT substrate 100, the electrophoretic layer 160 disposed between the TFT substrate 100 and the counter substrate 130, and a seal portion 152.

The counter substrate 130 includes a base material 131 and the counter electrode 133. The base material 131 is a light-transmitting glass substrate, a light-transmitting resin substrate, or a light-transmitting resin film. The counter electrode 133 is provided on a surface of the base material 131 opposed to the TFT substrate 100. The counter electrode 133 is made of ITO to serve as a light-transmitting conductive film. The counter electrode 133 is opposed to the pixel electrode 51 with the electrophoretic layer 160 interposed therebetween.

The seal portion 152 is provided between the TFT substrate 100 and the counter substrate 130. The electrophoretic layer 160 is sealed in an internal space surrounded by the TFT substrate 100, the counter substrate 130, and the seal portion 152. The seal portion 152 is provided with a coupling member 153. The counter electrode 133 is coupled to the common electrode 41 of the TFT substrate 100 through the coupling member 153. With this configuration, the common potential VCOM is supplied to the counter electrode 133.

The electrophoretic layer 160 includes a plurality of microcapsules 163. A plurality of black fine particles 161, a plurality of white fine particles 162, and a dispersion liquid 165 are encapsulated in each of the microcapsules 163. The black fine particles 161 and the white fine particles 162 are dispersed in the dispersion liquid 165. The dispersion liquid 165 is a light-transmitting liquid, such as silicone oil. The black fine particles 161 are electrophoretic particles, and are made using, for example, negatively charged graphite. The white fine particles 162 are electrophoretic particles, and are made using, for example, a positively charged titanium oxide ($TiO_2$).

The dispersion states of the black fine particles 161 and the white fine particles 162 are changed by an electric field generated between the pixel electrode 51 and the counter electrode 133. The transmission state of light transmitted through the electrophoretic layer 160 changes with the dispersion states of the black fine particles 161 and the white fine particles 162. Thus, an image is displayed on a display surface. For example, when the common potential VCOM (of 0 V, for example) is supplied to the counter electrode 133 and a negative potential is supplied to the pixel electrode 51, the negatively charged black fine particles 161 move toward the counter substrate 130, and the positively charged white fine particles 162 move toward the TFT substrate 100. As a result, when the TFT substrate 100 is viewed from the counter substrate 130 side, an area (pixel) overlapping with the pixel electrode 51 in the plan view is displayed in black.

As described above, the TFT substrate 100 according to the first embodiment includes the gate line GCL extending in the X-direction, the signal line SGL that extends in the Y-direction in a layer different from that of the gate line GCL, and intersects with the gate line GCL, the semiconductor film 21 that is provided in a layer different from those of the gate line GCL and the signal line SGL, and intersects with the gate line GCL, and the light-blocking films 31*r*1 and 31*r*2 and the drain 31*d* that are provided in a layer different from those of the gate line GCL and the semiconductor film 21, and cover at least portions of regions where the gate line GCL intersects with the semiconductor film 21. With this configuration, the light-blocking films 31*r*1 and 31*r*2 and the drain 31*d* made of a conductive film having the same composition as that of the light-blocking films 31*r*1 and 31*r*2 can block light from reaching the gate of the pixel transistor TR located closer to the base material 1 than the light-blocking films 31*r*1 and 31*r*2 and the drain 31*d*.

For example, the light-blocking film 31*r*1 is disposed at a location overlapping with the drain side of the gate of the first NMOS transistor ntr1; the light-blocking film 31*r*2 is disposed at a location overlapping with the drain side of the gate of the first PMOS transistor ptr1; and the drain 31*d* is disposed at a location overlapping with the drain side of the gate of the second NMOS transistor ntr2 and the drain side of the gate of the second PMOS transistor ptr2. This configuration blocks the light from reaching the drain sides of the gates of the pixel transistor TR.

For example, under an outdoor environment exposed to intense light, the light incident on the display surface of the EPD may pass through the electrophoretic layer to reach the pixel transistor. The intense light incident on the gates of the pixel transistor generates a photo leakage current due to a photoconductivity effect, and may cause a malfunction of the pixel transistor. This phenomenon may reduce reliability of the EPD.

However, in the TFT substrate 100 according to the first embodiment, since the drain sides of the gates of the pixel transistor TR are shielded from the light, the generation of the photo leakage current by the photoconductivity effect (hereinafter called photoelectric conversion) in the pixel transistor TR is reduced. This reduction of the photo leakage current allows the TFT substrate 100 to reduce the possible malfunction of the pixel transistor TR. As a result, the present embodiment can provide the TFT substrate 100 capable of improving the reliability.

With the TFT substrate 100 according to the first embodiment, the gate line GCL includes the gate main line (for example, the first gate main line GCL-Na) extending in the X-direction and the gate sub-line (for example, the first gate sub-line GCL-Nb) projecting from the gate main line. The semiconductor film 21 intersects with the gate main line and the gate sub-line at locations away from the signal line SGL in the X-direction.

With this configuration, the pixel transistor TR is not disposed at any location overlapping with the signal line SGL. As a result, the area of regions where the semiconductor film 21 overlaps with the signal line SGL is minimized. For example, in the TFT substrate 100, the regions where the semiconductor film 21 overlaps with the signal line SGL can be limited to only the periphery of the contact hole H1 and the periphery of the contact hole H2 where the semiconductor film 21 is coupled to the signal line SGL. With this configuration, the TFT substrate 100 can reduce the parasitic capacitance between the signal line SGL and the semiconductor film 21. For example, the TFT substrate 100 can have a smaller area of the regions where the semiconductor film 21 overlaps with the signal line SGL than that in a third embodiment of the present disclosure to be described later, and thus, can reduce the parasitic capacitance between the signal line SGL and the semiconductor film 21.

The gate line GCL includes the first gate line GCL-N and the second gate line GCL-P adjacent to the first gate line GCL-N in the Y-direction. The first gate line GCL-N includes the first gate main line GCL-Na extending in the X-direction and the first gate sub-line GCL-Nb projecting from the first gate main line GCL-Na. The second gate line GCL-P includes the second gate main line GCL-Pa extending in the X-direction and the second gate sub-line GCL-Pb projecting from the second gate main line GCL-Pa. The semiconductor film 21 has the first portion 21a that intersects with the first gate main line GCL-Na and the first gate sub-line GCL-Nb at locations away from the signal line SGL in the X-direction, and has the second portion 21b that intersects with the second gate main line GCL-Pa and the second gate sub-line GCL-Pb at locations away from the signal line SGL in the X-direction.

With this configuration, the pixel transistor TR of the TFT substrate 100 can have the complementary MOS (CMOS) configuration. As compared with a case where the pixel transistor does not have the CMOS configuration, the TFT substrate 100 can reduce the voltage amplitude applied to each of the NMOS transistor NTR and the PMOS transistor PTR, and thus, withstand voltages of the PMOS transistor PTR and the NMOS transistor NTR constituting the pixel transistor TR can be set lower.

An aspect of the TFT substrate 100 according to the first embodiment can be described in the following way.

The semiconductor film 21 has the linear portion 21a1 (an example of a first linear portion of the present disclosure) extending parallel to the first gate line GCL-N and the linear portion 21b1 (an example of a second linear portion of the present disclosure) extending parallel to the second gate line GCL-P. In the plan view, the first gate line GCL-N and the second gate line GCL-P are located between the linear portion 21a1 and the linear portion 21b1. In the plan view, the contact hole H4 (an example of a first contact hole of the present disclosure) of the planarizing film 33 coupling the drain electrode 31d to the pixel electrode 51 is located between the first gate line GCL-N and the second gate line GCL-P.

The semiconductor film 21 further has the linear portions 21a2 and 21b2 (an example of a third linear portion of the present disclosure) extending parallel to the signal line SGL. The linear portion 21a2 is coupled to the linear portion 21a1, and the linear portion 21b2 is coupled to the linear portion 21b1.

The contact hole H3 (an example of a second contact hole of the present disclosure) coupling the linear portions 21a2 and 21b2 to the drain electrode 31d is located between the first gate line GCL-N and the second gate line GCL-P in the plan view.

The interlayer insulating film 23 further has the contact hole H1 (an example of a third contact hole of the present disclosure) coupling the linear portion 21a1 to the signal line SGL, and has the contact hole H2 (an example of a fourth contact hole of the present disclosure) coupling the linear portion 21b1 to the signal line SGL.

The linear portion 21a2 intersects with the first gate line GCL-N. The linear portion 21b2 intersects with the second gate line GCL-P. The linear portions 21a2 and 21b2 do not overlap with the signal line SGL.

The TFT substrate 100 further includes the insulating base material 1, the pixel electrode 51 provided on the one surface 1a side of the base material 1, and the pixel transistor TR provided between the base material 1 and the pixel electrode 51. The pixel transistor TR includes the NMOS transistor NTR and the PMOS transistor PTR coupled in parallel to the NMOS transistor NTR. The gate of the NMOS transistor NTR is coupled to the first gate line GCL-N. The source of the NMOS transistor NTR is coupled to the signal line SGL. The drain of the NMOS transistor NTR is coupled to the pixel electrode 51. The gate of the PMOS transistor is coupled to the second gate line GCL-P. The source of the PMOS transistor is coupled to the signal line SGL. The drain of the PMOS transistor is coupled to the pixel electrode 51.

The display device 200 according to the first embodiment includes the above-described TFT substrate 100 and the display layer disposed so as to be opposed to the TFT substrate 100. The display layer is, for example, the electrophoretic layer 160. As a result, the present embodiment can provide an electrophoretic device capable of improving the display performance as the display device 200.

Modifications

In the above-described first embodiment, the description has been made that the first gate sub-line GCL-Nb and the second gate sub-line GCL-Pb are arranged so as to be displaced from each other in the X-direction. This arrangement has been described to be able to prevent the first gate sub-line GCL-Nb and the second gate sub-line GCL-Pb from facing each other between the pixels PX adjacent in the Y-direction. In the present embodiment, however, the arrangement of the gate lines GCL is not limited to this arrangement.

Figure 16:
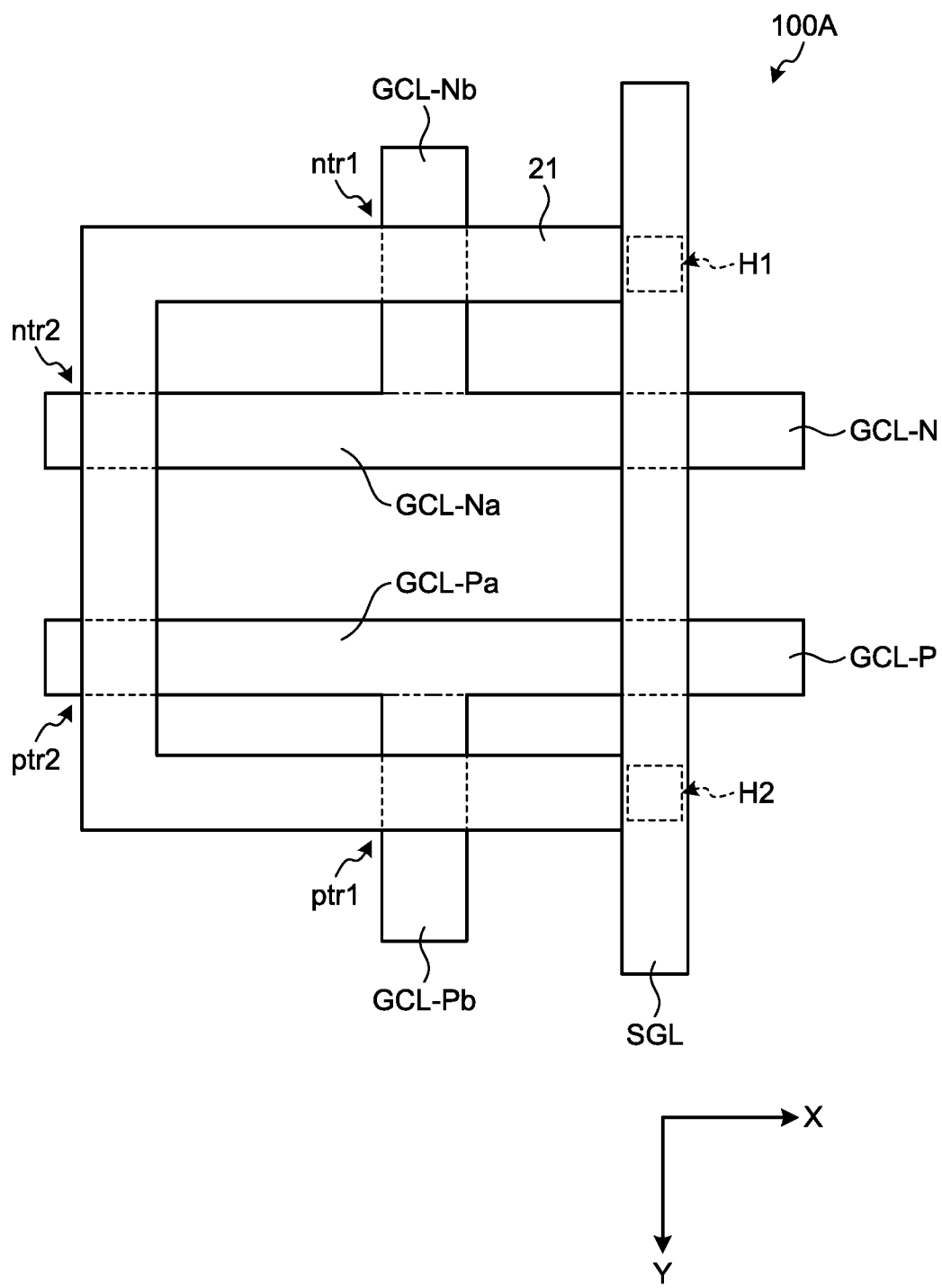
FIG. 16 is a plan view illustrating a configuration example of a TFT substrate according to a first modification of the first embodiment.

FIG. 16 is a plan view illustrating a configuration example of a TFT substrate according to a first modification of the first embodiment. As illustrated in FIG. 16, in a TFT substrate 100A according to the first modification of the first embodiment, the first gate sub-line GCL-Nb faces the second gate sub-line GCL-Pb in the Y-direction in each of the pixels PX. The first gate sub-line GCL-Nb also faces the second gate sub-line GCL-Pb in the Y-direction between the pixels PX adjacent in the Y-direction. In addition, as illustrated in FIG. 16, the recesses 21RE (refer to FIG. 5) need not be provided on the semiconductor film 21.

Such a configuration can also improve the reliability because the TFT substrate 100A includes the light-blocking films 31r1 and 31r2 and the drain 31d having the light-blocking function. Also in the TFT substrate 100A, the pixel transistor TR is not disposed at any location overlapping with the signal line SGL in the plan view. As a result, the TFT substrate 100A can reduce the parasitic capacitance between the signal line SGL and the semiconductor film 21.

Figure 17:
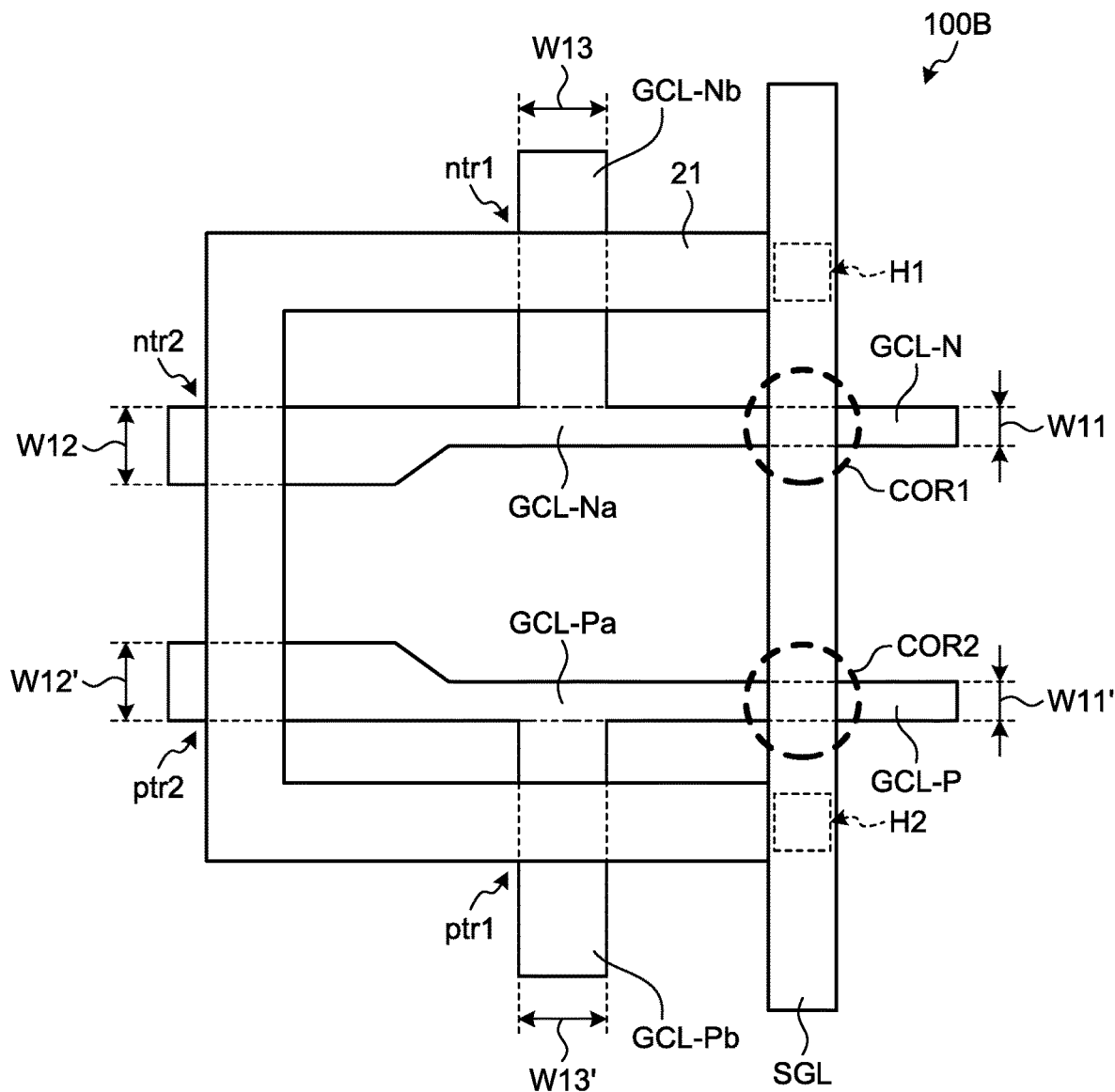
FIG. 17 is a plan view illustrating a configuration example of a TFT substrate according to a second modification of the first embodiment.

In the above-described first embodiment, a line width of the gate line GCL in a region intersecting with the signal line SGL in the plan view may be smaller than those in other regions. FIG. 17 is a plan view illustrating a configuration example of a TFT substrate according to a second modification of the first embodiment. As illustrated in FIG. 17, in the first gate main line GCL-Na of a TFT substrate 100B according to the second modification of the first embodiment, when W11 denotes a line width of a region (hereinafter, called "intersection region") COR1 intersecting with the signal line SGL in the plan view, and W12 denotes a line width of an intersection region with the semiconductor film 21 (that is, a gate length of the second NMOS transistor ntr2), W11 is smaller than W12 (W11<W12). In the first gate sub-line GCL-Nb, when W13 denotes a line width of an intersection region with the semiconductor film 21 (that is, a gate length of the first NMOS transistor ntr1), W11 is smaller than W13 (W11<W13). With this configuration, the TFT substrate 100B can reduce the parasitic capacitance of the first gate line GCL-N to a value lower than that when W11≥W12 or when W11≥W13.

In the same way, in the second gate main line GCL-Pa of the TFT substrate 100B, when W11' denotes a line width of an intersection region COR2 with the signal line SGL, and W12' denotes a line width of an intersection region with the semiconductor film 21 (that is, a gate length of the second PMOS transistor ptr2), W11' is smaller than W12' (W11'<W12'). In the second gate sub-line GCL-Pb, when W13' denotes a line width of an intersection region with the semiconductor film 21 (that is, a gate length of the first PMOS transistor ptr1), W11' is smaller than W13' (W11'<W13'). With this configuration, the TFT substrate 100B can reduce the parasitic capacitance of the second gate line GCL-P to a value lower than that when W11'≥W12' or when W11'≥W13'.

Figure 18:
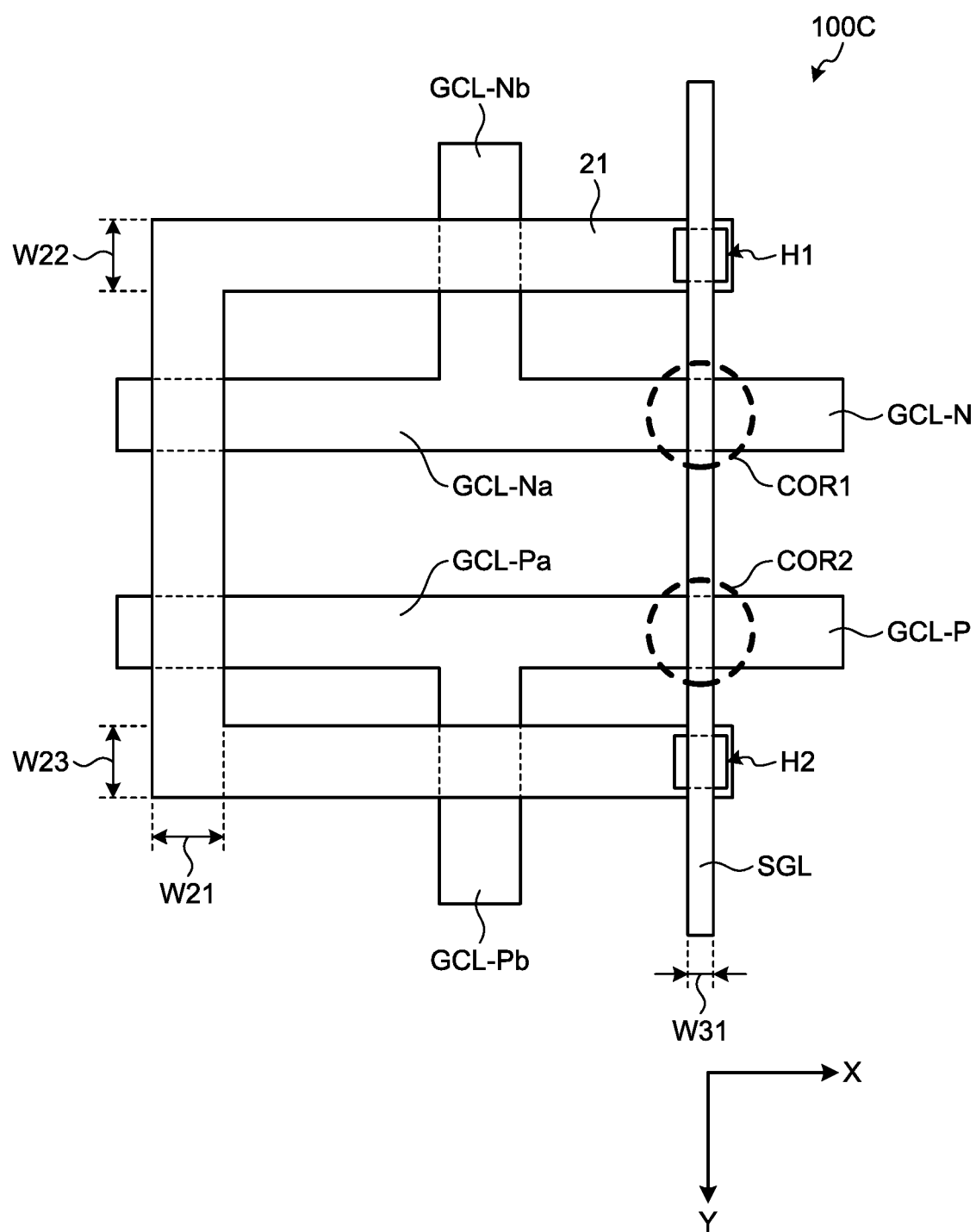
FIG. 18 is a plan view illustrating a configuration example of a TFT substrate according to a third modification of the first embodiment.

In the above-described first embodiment, the signal line SGL may have a line width smaller than that of the semiconductor film 21. FIG. 18 is a plan view illustrating a configuration example of a TFT substrate according to a third modification of the first embodiment. As illustrated in FIG. 18, in the semiconductor film 21 of a TFT substrate 100C according to the third modification of the first embodiment, when W21 denotes a line width of a portion intersecting with the first gate main line GCL-Na or the second gate main line GCL-Pa, and W31 denotes the line width of the signal line SGL, W31 is smaller than W21 (W21>W31). In the semiconductor film 21, when W22 denotes a line width of a portion intersecting with the first gate sub-line GCL-Nb, W31 is smaller than W22 (W22>W31). In the semiconductor film 21, when W23 denotes a line width of a portion intersecting with the second gate sub-line GCL-Pb, W31 is smaller than W23 (W23>W31). With this configuration, the TFT substrate 100C can reduce the parasitic capacitance of the signal line SGL to a value lower than that when W22≤W31, or when W23≤W31.

Figure 19:
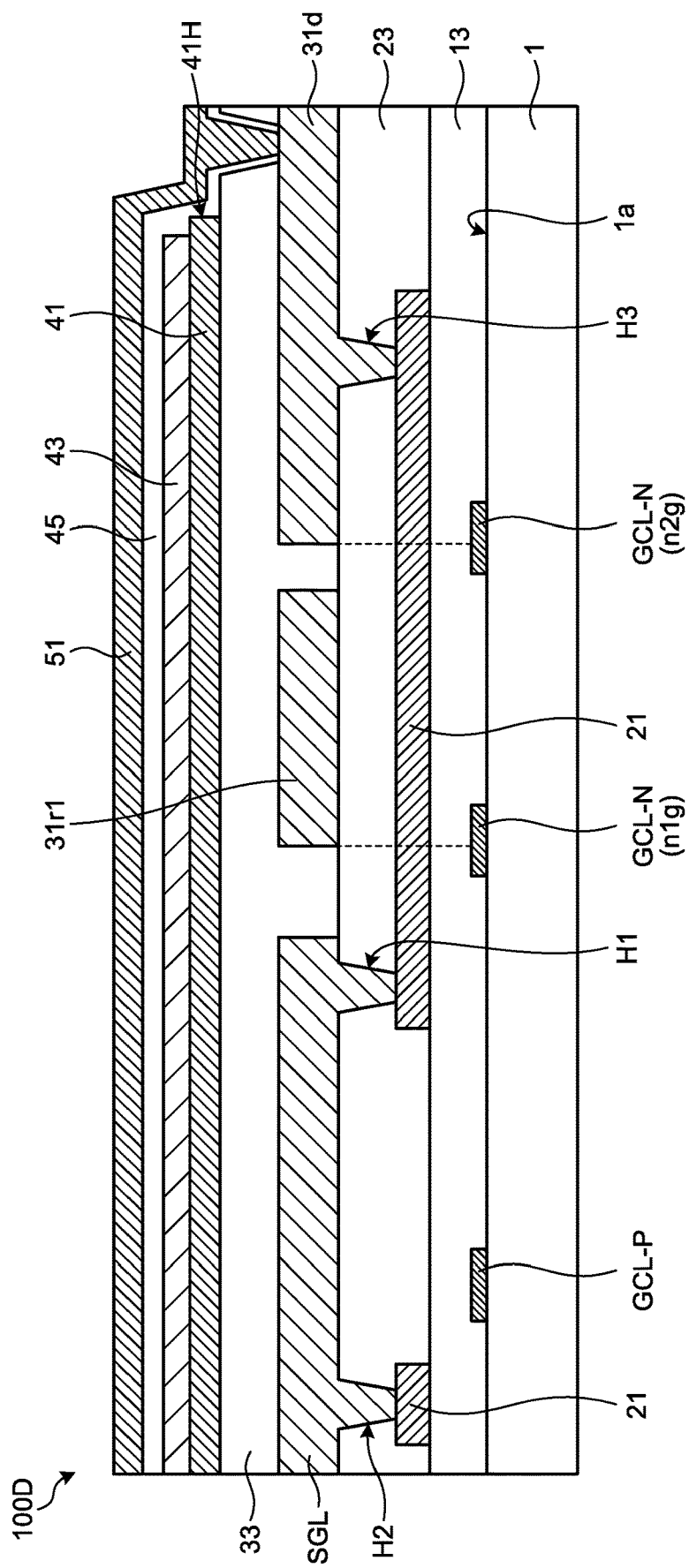
FIG. 19 is a sectional view illustrating a configuration example of a TFT substrate according to a fourth modification of the first embodiment.

In the present embodiment, a reflective film may be provided between the planarizing film 33 and the pixel electrode 51. FIG. 19 is a sectional view illustrating a configuration example of a TFT substrate according to a fourth modification of the first embodiment. As illustrated in FIG. 19, in a TFT substrate 100D according to the fourth modification of the first embodiment, a reflective film 43 is provided on the common electrode 41. The reflective film 43 is made of molybdenum and aluminum. The reflective film 43 is constituted by, for example, a multilayered structure film obtained by stacking molybdenum, aluminum, and molybdenum in this order from the base material 1 side. Silver (Ag) may be used as the reflective film 43 to further increase reflectance thereof. The reflective film 43 is covered with the insulating film 45. With this configuration, the reflective film 43 can reflect toward the pixel electrode 51, incident light that has passed through the counter substrate 130 (refer to FIG. 15) and the electrophoretic layer 160 (refer to FIG. 15) and is incident from the pixel electrode 51 side. The reflective film 43 may have a structure of being provided under the common electrode 41 and interposed between the common electrode 41 and the planarizing film 33. With this configuration, the TFT substrate 100D can increase brightness of display.

In the above-described first embodiment, the description has been made that each of the NMOS transistor NTR and the PMOS transistor PTR included in the pixel transistor TR is the bottom-gate transistor. In the present embodiment, however, each of the NMOS transistor NTR and the PMOS transistor PTR is not limited to the bottom-gate transistor. In the present embodiment, each of the NMOS transistor NTR and the PMOS transistor PTR may be a top-gate transistor.

Figure 20:
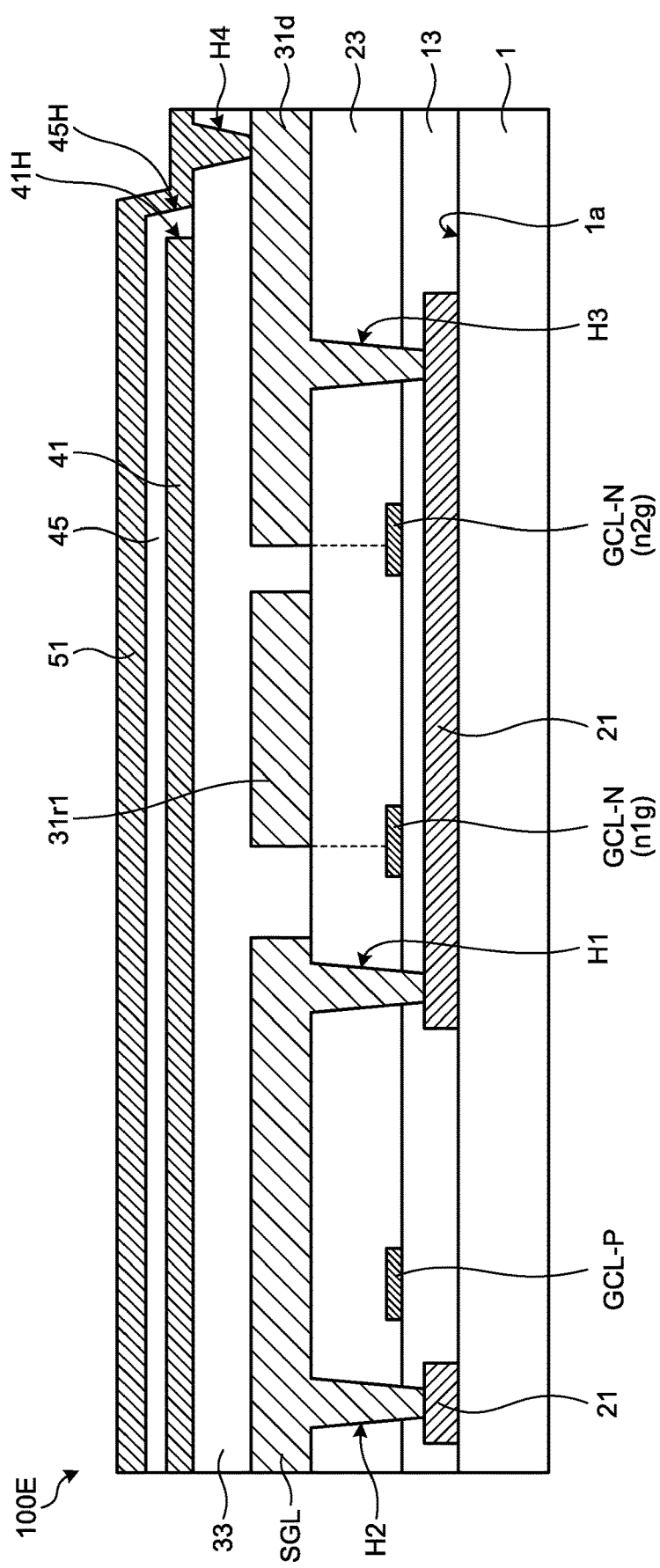
FIG. 20 is a sectional view illustrating a TFT substrate according to a fifth modification of the first embodiment.

FIG. 20 is a sectional view illustrating a TFT substrate according to a fifth modification of the first embodiment. FIG. 20 illustrates a section obtained by cutting a TFT substrate 100E according to the fifth modification of the first embodiment in the same position as that of line IX-IX' (refer to FIG. 8). In the TFT substrate 100E, each of the NMOS transistor NTR and the PMOS transistor PTR is the top-gate transistor. For example, as illustrated in FIG. 20, in the TFT substrate 100E, the semiconductor film 21 is provided on the one surface 1a of the base material 1. The insulating film 13 is also provided on the one surface 1a of the base material 1. The insulating film 13 covers the semiconductor film 21. The first gate line GCL-N and the second gate line GCL-P are provided on the gate insulating film 13. A portion of the insulating film 13 interposed between the first gate line GCL-N or the second gate line GCL-P and the semiconductor film 21 serves as the gate insulating film. Such a configuration also provides the same effects as those of the above-described first embodiment.

In the above-described first embodiment, the description has been made that the pixel electrode 51 and the common electrode 41 are each constituted by the light-transmitting conductive film. In the present embodiment, however, at least one of the pixel electrode 51 and the common electrode 41 may not be a light-transmitting conductive film and may be made of a metal, such as aluminum or silver. For example, if the pixel electrode 51 is made of the metal, the pixel electrode 51 can reflect incident light. If the common electrode 41 is made of the metal, the common electrode 41 can reflect the incident light toward the pixel electrode 51 side.

In the first embodiment, the description has been made that the display layer opposed to the TFT substrate 100 is the electrophoretic layer 160. In the present embodiment, however, the display layer is not limited to the electrophoretic layer 160. The display layer may be, for example, a liquid crystal layer. As a result, a liquid crystal display device with the improved display performance can be provided.

In the present embodiment, an optical sheet (not illustrated) may be provided on the pixel electrode 51. For example, if the display layer is the liquid crystal layer, an orientation film may be provided as the optical sheet between the pixel electrode 51 and the liquid crystal layer. In the TFT substrate 100, this configuration allows liquid crystal molecules included in the liquid crystal layer to align in a certain direction.

Second Embodiment

In the above-described first embodiment, the description has been made that the first portion 21a and the second portion 21b constituting the semiconductor film 21 are L-shaped in the plan view. In a second embodiment of the present disclosure, however, the shape of the semiconductor film 21 is not limited thereto. In the above-described first embodiment, the description has also been made that the gate line GCL includes the one first gate sub-line GCL-Nb and the one second gate sub-line GCL-Pb in each of the pixels PX. In the present embodiment, however, the configuration of the gate line GCL is not limited thereto.

Figure 21:
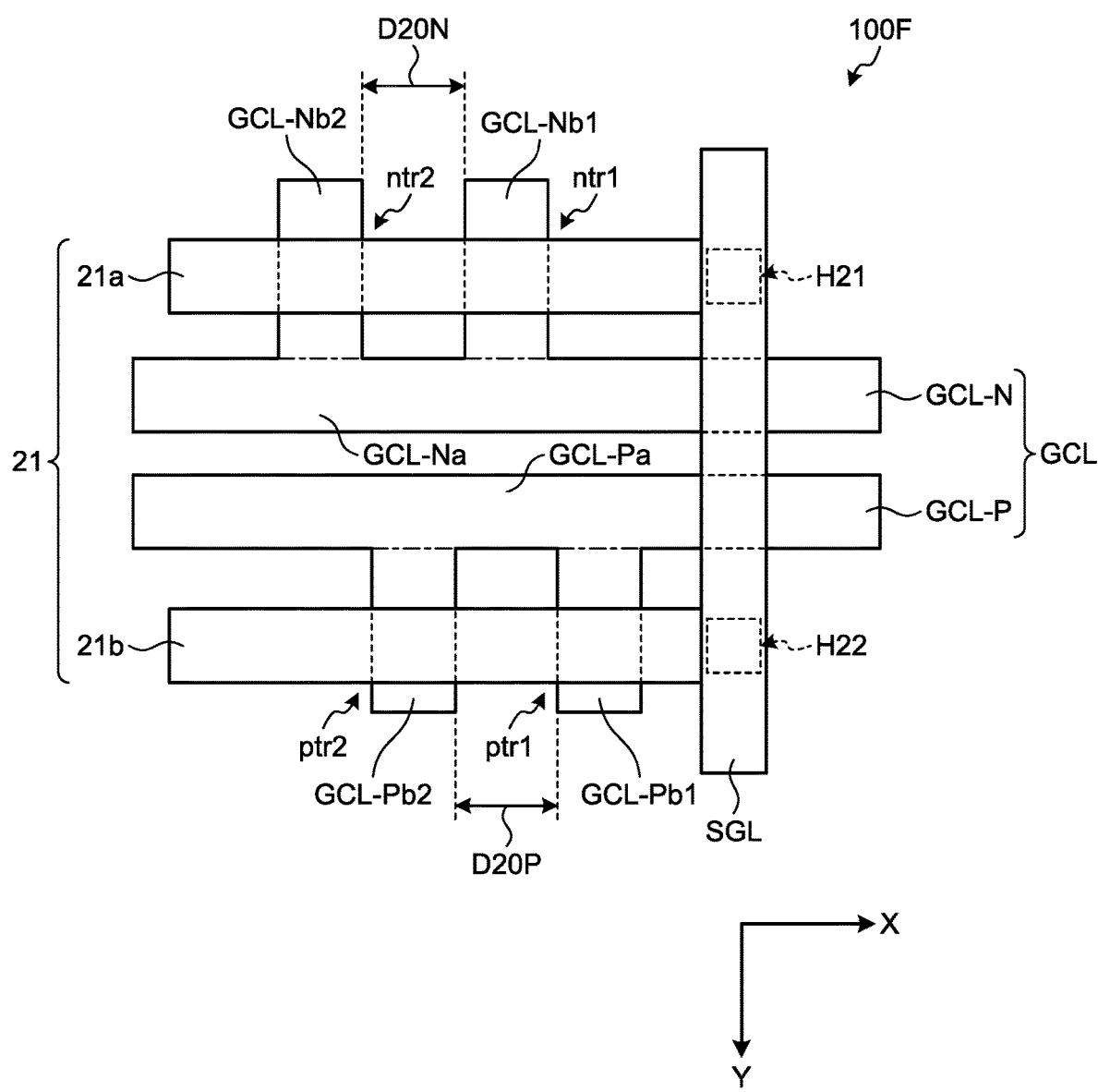
FIG. 21 is a plan view illustrating a configuration example of the gate line, the semiconductor film, and the signal line in one of the pixels of a TFT substrate according to a second embodiment of the present disclosure.
Figure 23:
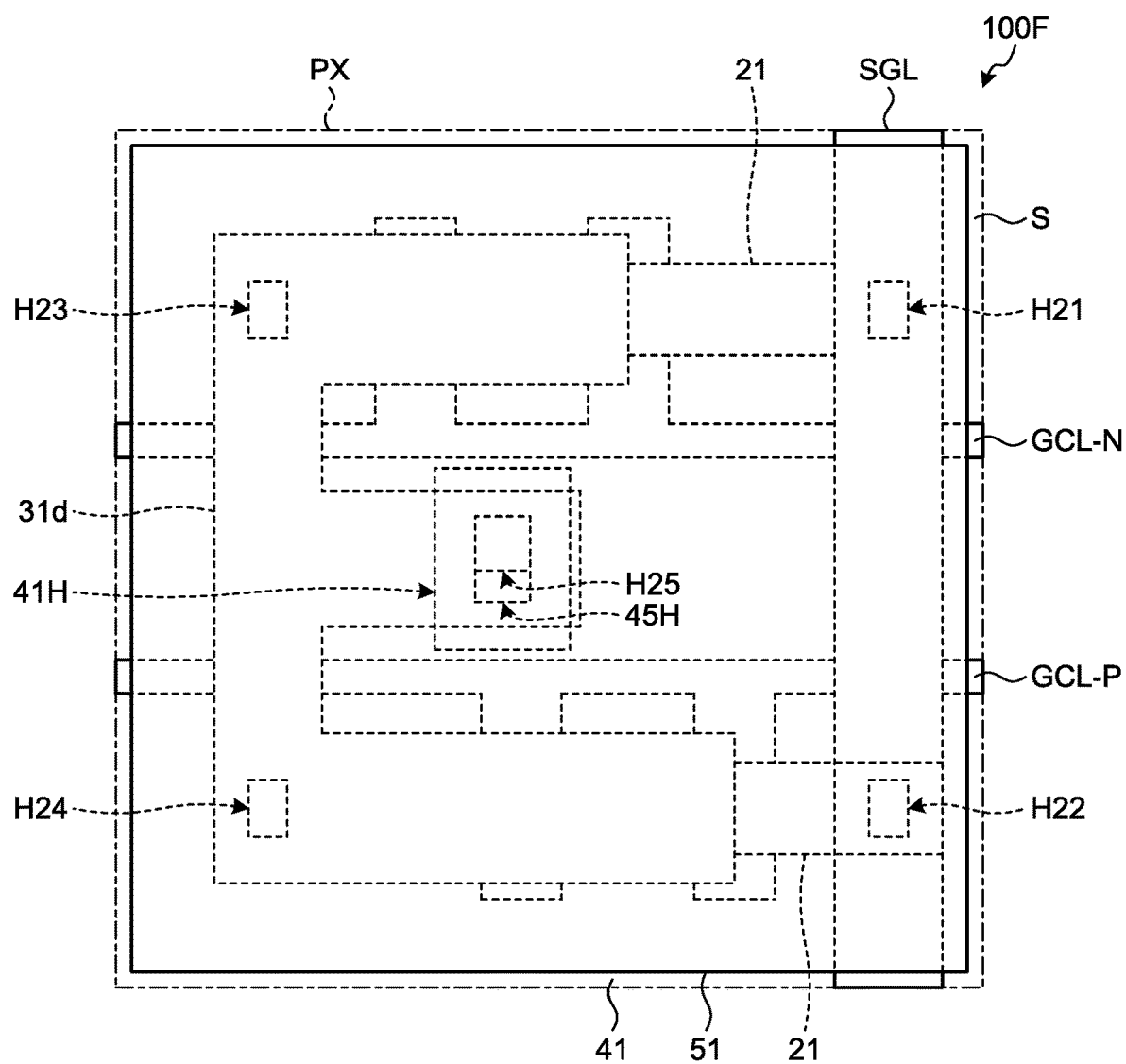
FIG. 23 is a plan view illustrating a configuration example of one of the pixels of the TFT substrate according to the second embodiment.
Figure 24:
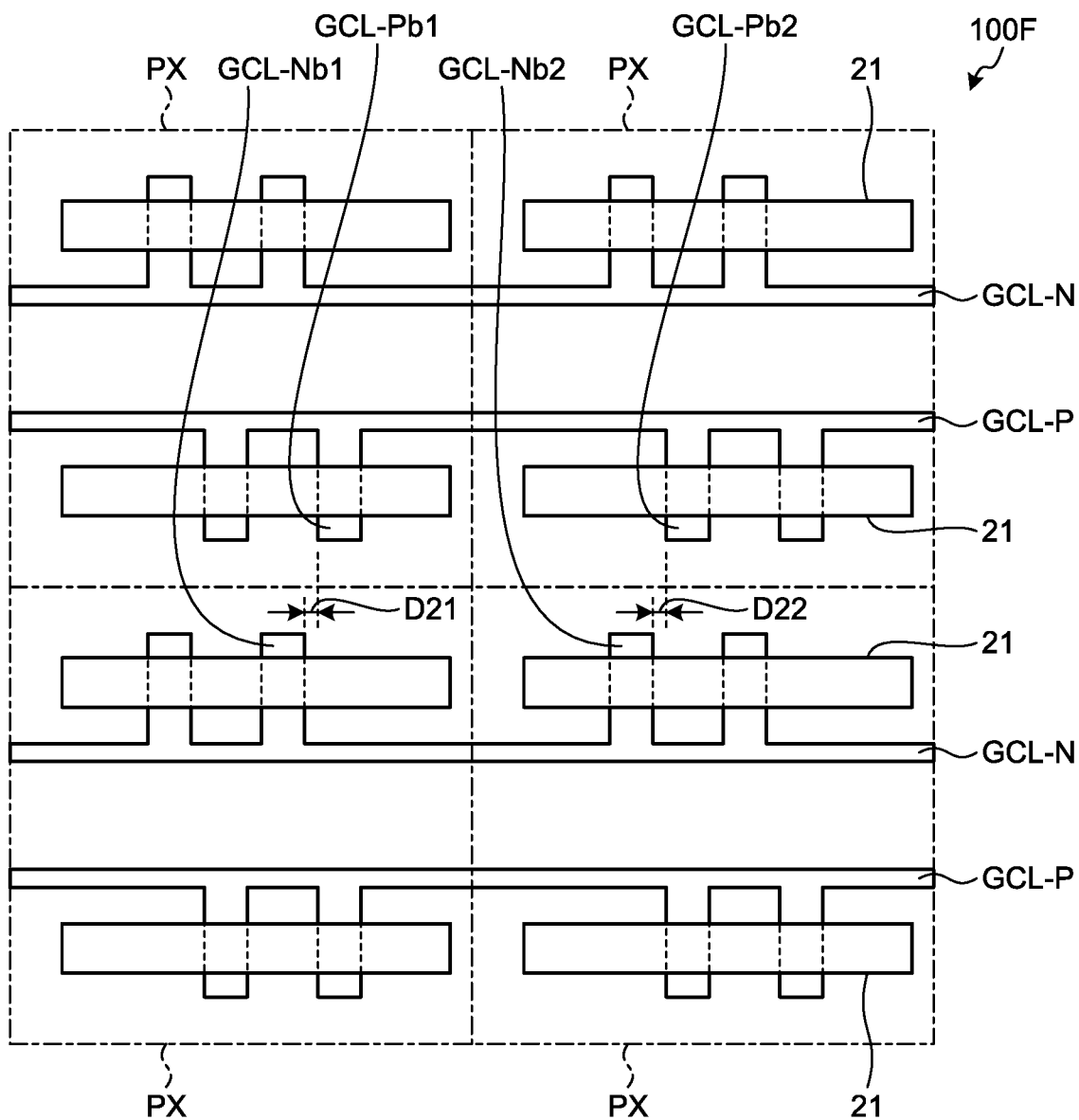
FIG. 24 is a plan view illustrating relations among the gate lines and the semiconductor films between adjacent pixels on the TFT substrate according to the second embodiment.

FIG. 21 is a plan view illustrating a configuration example of the gate line, the semiconductor film, and the signal line in one of the pixels of a TFT substrate according to the second embodiment. FIG. 22 is a plan view illustrating a configuration example of the signal line and the drain in one of the pixels of the TFT substrate according to the second embodiment. FIG. 22 illustrates portions covered with the interlayer insulating film 23 with dashed lines. FIG. 23 is a plan view illustrating a configuration example of one of the pixels of the TFT substrate according to the second embodiment. FIG. 23 illustrates portions covered with the pixel electrode 51 with dashed lines. To avoid complexity of the drawing, FIG. 23 does not illustrate the planarizing film 33 (refer to FIG. 9), the interlayer insulating film 23, and the insulating film 13 (refer to FIG. 9). FIG. 24 is a plan view illustrating relations among the gate lines and the semiconductor films between adjacent pixels on the TFT substrate according to the second embodiment.

As illustrated in FIG. 21, a TFT substrate 100F according to the second embodiment includes the gate line GCL, the signal line SGL intersecting with the gate line GCL in the plan view, and the semiconductor film 21 coupled to the signal line SGL. The gate line GCL includes the first gate line GCL-N and the second gate line GCL-P adjacent to the first gate line GCL-N in the Y-direction.

The first gate line GCL-N includes the first gate main line GCL-Na extending in the X-direction and two first gate sub-lines GCL-Nb1 and GCL-Nb2 that are coupled to the first gate main line GCL-Na and extend in the Y-direction. The first gate sub-lines GCL-Nb1 and GCL-Nb2 project in the Y-direction from the first gate main line GCL-Na. The first gate sub-lines GCL-Nb1 and GCL-Nb2 are disposed in each of the pixels PX, and are adjacent to each other in the X-direction.

The second gate line GCL-P includes the second gate main line GCL-Pa extending in the X-direction and two second gate sub-lines GCL-Pb1 and GCL-Pb2 that are coupled to the second gate main line GCL-Pa and extend in the Y-direction. The second gate sub-lines GCL-Pb1 and GCL-Pb2 project in the Y-direction from the second gate main line GCL-Pa. The second gate sub-lines GCL-Pb1 and GCL-Pb2 are disposed in each of the pixels PX, and are adjacent to each other in the X-direction.

The semiconductor film 21 has the first portion 21a and the second portion 21b. The first portion 21a is coupled to the signal line SGL through a contact hole H21, and intersects with each of the first gate sub-lines GCL-Nb1 and GCL-Nb2 in the plan view. The second portion 21b is coupled to the signal line SGL through a contact hole H22, and intersects with each of the second gate sub-lines GCL-Pb1 and GCL-Pb2 in the plan view. The shape in the plan view of each of the first portion 21a and the second portion 21b is a linear shape. The first portion 21a and the second portion 21b extend in the X-direction.

As illustrated in FIG. 22, the interlayer insulating film 23 is provided above the semiconductor film 21. The signal line SGL and the drain 31d are provided above the interlayer insulating film 23. The first portion 21a of the semiconductor film 21 is coupled to the drain 31d through a contact hole H23. The contact hole H21 is provided at a location overlapping with one end in the X-direction of the first portion 21a. The contact hole H23 is provided at a location overlapping with the other end in the X-direction of the first portion 21a. The second portion 21b of the semiconductor film 21 is coupled to the drain 31d through a contact hole H24. The contact hole H22 is provided at a location overlapping with one end in the X-direction of the second portion 21b. The contact hole H24 is provided at a location overlapping with the other end in the X-direction of the second portion 21b.

As illustrated in FIG. 21, in the TFT substrate 100F according to the second embodiment, the pixel transistor TR is not formed in a region overlapping with the first gate main line GCL-Na in the plan view. In the TFT substrate 100F, the pixel transistor TR is formed in regions overlapping with the first gate sub-lines GCL-Nb1 and GCL-Nb2 in the plan view. For example, the first NMOS transistor ntr1 is provided at a location where the first gate sub-line GCL-Nb1 intersects with the first portion 21a of the semiconductor film 21, and the second NMOS transistor ntr2 is provided at a location where the first gate sub-line GCL-Nb2 intersects with first portion 21a. The line width of the first gate main line GCL-Na has no influence on the gate length of the pixel transistor TR. Therefore, in the TFT substrate 100F, the line width of the first gate main line GCL-Na can be set smaller than that of each of the first gate sub-lines GCL-Nb1 and GCL-Nb2.

For example, as illustrated in FIG. 22, in the TFT substrate 100F, when W14 denotes the line width of the first gate main line GCL-Na, and W15 denotes a line width of the first gate sub-line GCL-Nb2 (or the first gate sub-line GCL-Nb1), a relation may hold such that W14<W15. With this configuration, the TFT substrate 100F can reduce the parasitic capacitance of the first gate line GCL-N to a value lower than that when W14 W15.

In the same way, as illustrated in FIG. 21, the first PMOS transistor ptr1 is provided at a location where the second gate sub-line GCL-Pb1 intersects with the second portion 21b of the semiconductor film 21, and the second NMOS transistor ntr2 is provided at a location where the first gate sub-line GCL-Nb2 intersects with the second portion 21b. The line width of the second gate main line GCL-Pa has no influence on the gate length of the pixel transistor TR. Therefore, in the TFT substrate 100F, the line width of the second gate main line GCL-Pa can be set smaller than that of each of the second gate sub-lines GCL-Pb1 and GCL-Pb2. With this configuration, the TFT substrate 100F can reduce the parasitic capacitance of the second gate line GCL-P.

When W31 denotes the line width of the signal line SGL, a relation may hold such that W14<W31. With this configuration, the TFT substrate 100F can reduce the parasitic capacitance of the first gate line GCL-N to a value lower than that when W14≧W31. In the same way, in the TFT substrate 100F, the line width of the second gate line GCL-P may be smaller than that of the signal line SGL. With this configuration, the TFT substrate 100F can reduce the parasitic capacitance of the second gate line GCL-P.

The contact holes H21, H22, H23, and H24 are formed in the interlayer insulating film 23. A contact hole H25 illustrated in FIG. 23 is formed in the planarizing film 33 (refer to FIG. 9). As illustrated in FIG. 23, the drain 31d is coupled to the pixel electrode 51 through the contact hole H25.

As illustrated in FIG. 22, in the TFT substrate 100F, the drain side of the gate of the first NMOS transistor ntr1 and the drain side of the gate of the first PMOS transistor ptr1 overlap with the drain 31d in the plan view, and the whole region of the gate of the second NMOS transistor ntr2 and the whole region of the gate of the second PMOS transistor ptr2 overlap with the drain 31d in the plan view.

In each of the pixels PX on the TFT substrate 100F, a separation distance in the X-direction between the first gate sub-lines GCL-Nb1 and GCL-Nb2 has the same value as that of a separation distance between the second gate sub-lines GCL-Pb1 and GCL-Pb2. For example, as illustrated in FIG. 21, when D20N denotes the separation distance in the X-direction between the first gate sub-lines GCL-Nb1 and GCL-Nb2, and D20P denotes the separation distance between the second gate sub-lines GCL-Pb1 and GCL-Pb2, D20N has the same value as D20P (D20N=D20P). In the TFT substrate 100F, the first gate sub-line GCL-Nb1 and the second gate sub-line GCL-Pb1 are arranged so as to be displaced from each other in the X-direction, and the first gate sub-line GCL-Nb2 and the second gate sub-line GCL-Pb2 are also arranged so as to be displaced from each other in the X-direction.

As illustrated in FIG. 24, this arrangement can prevent the first gate sub-line GCL-Nb1 and the second gate sub-line GCL-Pb1 from facing each other between the pixels PX adjacent in the Y-direction. The first gate sub-line GCL-Nb2 and the second gate sub-line GCL-Pb2 can also be prevented from facing each other. Even without widening a space between the pixels PX adjacent in the Y-direction, the TFT substrate 100F can increase a separation distance D21 in the X-direction between the first gate sub-line GCL-Nb1 of one of the pixels PX and the second gate sub-line GCL-Pb1 of another of the pixels PX. In the same way, even without widening the space between the pixels PX adjacent in the Y-direction, the TFT substrate 100F can ensure a larger separation distance D22 in the X-direction between the first gate sub-line GCL-Nb2 of one of the pixels PX and the second gate sub-line GCL-Pb2 of the other of the pixels PX. With this configuration, the TFT substrate 100F can prevent the gate lines GCL from affecting each other between the pixels PX adjacent in the Y-direction.

As described above, the TFT substrate 100F according to the second embodiment includes the gate line GCL extending in the X-direction, the signal line SGL that extends in the Y-direction in a layer different from that of the gate line GCL, and intersects with the gate line GCL, the semiconductor film 21 that is provided in a layer different from those of the gate line GCL and the signal line SGL, and intersects with the gate line GCL, and the drain 31d that is provided in a layer different from those of the gate line GCL and the semiconductor film 21, and covers at least portions of regions where the gate line GCL intersects with the semiconductor film 21. With this configuration, the portions of the drain 31d can block the light from reaching the gate of the pixel transistor TR located closer to the base material 1 than the drain 31d.

For example, the drain 31d is disposed at a location overlapping with the drain side of the gate of the first NMOS transistor ntr1, the drain side of the gate of the first PMOS transistor ptr1, the whole region of the gate of the second NMOS transistor ntr2, and the whole region of the gate of the second PMOS transistor ptr2. This configuration shields at least a portion on the drain side of the pixel transistor TR from the light, and reduces the photoelectric conversion. As a result, the TFT substrate 100F can reduce the possible malfunction of the pixel transistor TR, and can improve the reliability.

With the TFT substrate 100F according to the second embodiment, the gate line GCL includes the gate main line (for example, the first gate main line GCL-Na) extending in the X-direction and the gate sub-lines (for example, the first gate sub-lines GCL-Nb1 and GCL-Nb2) projecting from the gate main line. The semiconductor film 21 intersects with the gate main line and the gate sub-lines at locations away from the signal line SGL in the X-direction.

With this configuration, the pixel transistor TR is not disposed at any location overlapping with the signal line SGL. As a result, the area of regions where the semiconductor film 21 overlaps with the signal line SGL is minimized. For example, in the TFT substrate 100F, the regions where the semiconductor film 21 overlaps with the signal line SGL can be limited to only the periphery of the contact hole H21 and the periphery of the contact hole H22 where the semiconductor film 21 is coupled to the signal line SGL. With this configuration, the TFT substrate 100F can reduce the parasitic capacitance between the signal line SGL and the semiconductor film 21. For example, the TFT substrate 100F can have a smaller area of the regions where the semiconductor film 21 overlaps with the signal line SGL than that in the third embodiment to be described later, and thus, can reduce the parasitic capacitance between the signal line SGL and the semiconductor film 21.

The gate line GCL includes the first gate line GCL-N and the second gate line GCL-P adjacent to the first gate line GCL-N in the Y-direction. The first gate line GCL-N includes the first gate main line GCL-Na extending in the X-direction and the two first gate sub-lines GCL-Nb1 and GCL-Nb2 projecting from the first gate main line GCL-Na. The second gate line GCL-P includes the second gate main line GCL-Pa extending in the X-direction and the two second gate sub-lines GCL-Pb1 and GCL-Pb2 projecting from the second gate main line GCL-Pa. The semiconductor film 21 has the first portion 21a that intersects with the two first gate sub-lines GCL-Nb1 and GCL-Nb2 at locations away from the signal line SGL in the X-direction, and has the second portion 21b that intersects with the two second gate sub-lines GCL-Pb1 and GCL-Pb2 at locations away from the signal line SGL in the X-direction.

With this configuration, the pixel transistor TR of the TFT substrate 100F can have the complementary MOS (CMOS) configuration. As compared with the case where the pixel transistor does not have the CMOS configuration, the TFT substrate 100F can reduce the voltage amplitude applied to each of the NMOS transistor NTR and the PMOS transistor PTR, and thus, the withstand voltages of the PMOS transistor PTR and the NMOS transistor NTR constituting the pixel transistor TR can be set lower.

An aspect of the TFT substrate 100F according to the second embodiment can be described in the following way.

The semiconductor film 21 has the linear first portion 21a (an example of the first linear portion of the present disclosure) extending parallel to the first gate line GCL-N and the linear second portion 21b (an example of the second linear portion of the present disclosure) extending parallel to the second gate line GCL-P. In the plan view, the first gate main line GCL-Na of the first gate line GCL-N and the second gate main line GCL-Pa of the second gate line GCL-P are located between the first portion 21a and the second portion 21b. In the plan view, the contact hole H25 (an example of the first contact hole of the present disclosure) of the planarizing film 33 coupling the drain electrode 31d to the pixel electrode 51 is located between the first gate main line GCL-Na and the second gate main line GCL-Pa.

The interlayer insulating film 23 has the contact hole H23 (an example of a sixth contact hole of the present disclosure) coupling the linear first portion 21a (the example of the first linear portion of the present disclosure) to the drain electrode 31d, and has the contact hole H24 (an example of a seventh contact hole of the present disclosure) coupling the linear second portion 21b (the example of the second linear portion of the present disclosure) to the drain electrode 31d.

The interlayer insulating film 23 further has the contact hole H21 (an example of an eighth contact hole of the present disclosure) coupling the first portion 21a to the signal line SGL, and has the contact hole H22 (an example of a ninth contact hole of the present disclosure) coupling the second portion 21b to the signal line SGL.

Modification

In the above-described second embodiment, the description has been made that the first gate sub-line GCL-Nb1 and the second gate sub-line GCL-Pb1 are arranged so as to be displaced from each other in the X-direction, and the first gate sub-line GCL-Nb2 and the second gate sub-line GCL-Pb2 are also arranged so as to be displaced from each other in the X-direction. In the present embodiment, however, the arrangement of the gate lines GCL is not limited to this arrangement.

Figure 25:
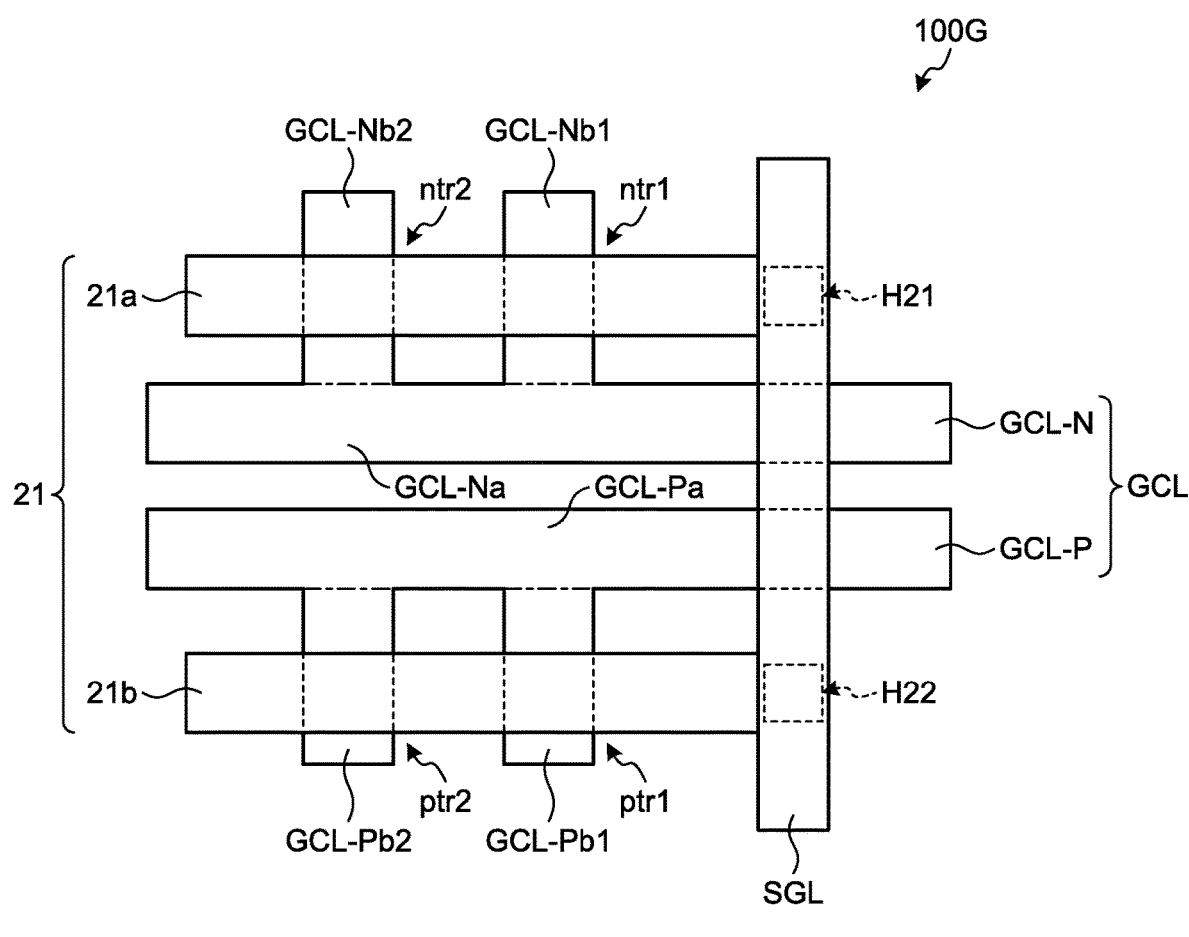
FIG. 25 is a plan view illustrating a configuration example of a TFT substrate according to a modification of the second embodiment.

FIG. 25 is a plan view illustrating a configuration example of a TFT substrate according to a modification of the second embodiment. As illustrated in FIG. 25, in a TFT substrate 100G according to the modification of the second embodiment, the first gate sub-line GCL-Nb1 faces the second gate sub-line GCL-Pb1 in the Y-direction in each of the pixels PX. The first gate sub-line GCL-Nb1 also faces the second gate sub-line GCL-Pb1 in the Y-direction between the pixels PX adjacent in the Y-direction. Such a configuration can also improve the reliability because the TFT substrate 100G includes the drain 31d having the light-blocking function. Also in the TFT substrate 100G, the pixel transistor TR is not disposed at any location overlapping with the signal line SGL in the plan view. As a result, the TFT substrate 100G can reduce the parasitic capacitance between the signal line SGL and the semiconductor film 21.

Third Embodiment

In the above-described first and second embodiments, the description has been made that the gate line GCL includes the gate main lines extending in the X-direction and the gate sub-lines extending in the Y-direction. In the third embodiment of the present disclosure, however, the configuration of the gate line GCL is not limited thereto. The gate line GCL may be constituted by only the gate main lines extending in the X-direction.

Figure 27:
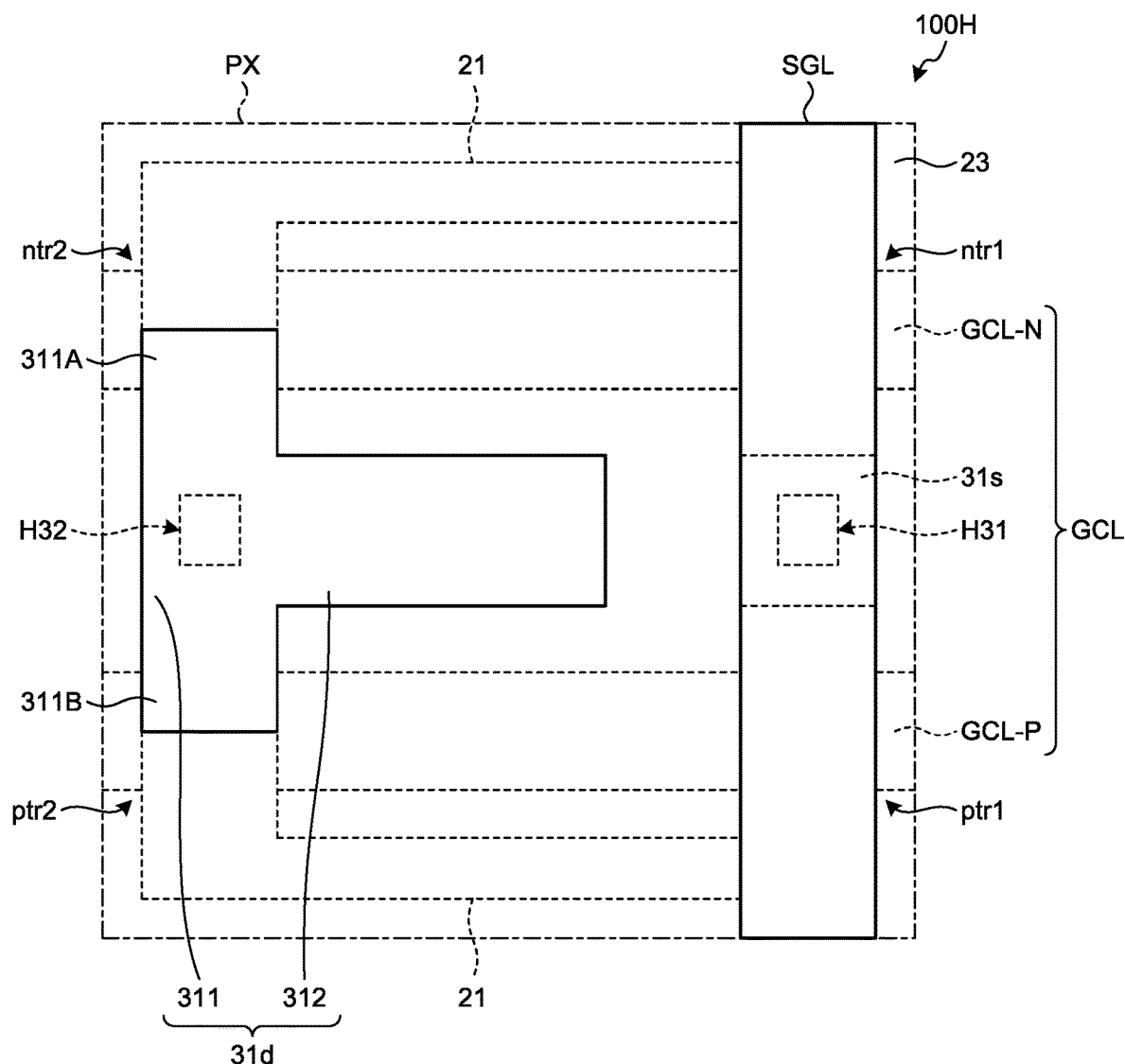
FIG. 27 is a plan view illustrating a configuration example of the signal line and the drain in one of the pixels of the TFT substrate according to the third embodiment.
Figure 28:
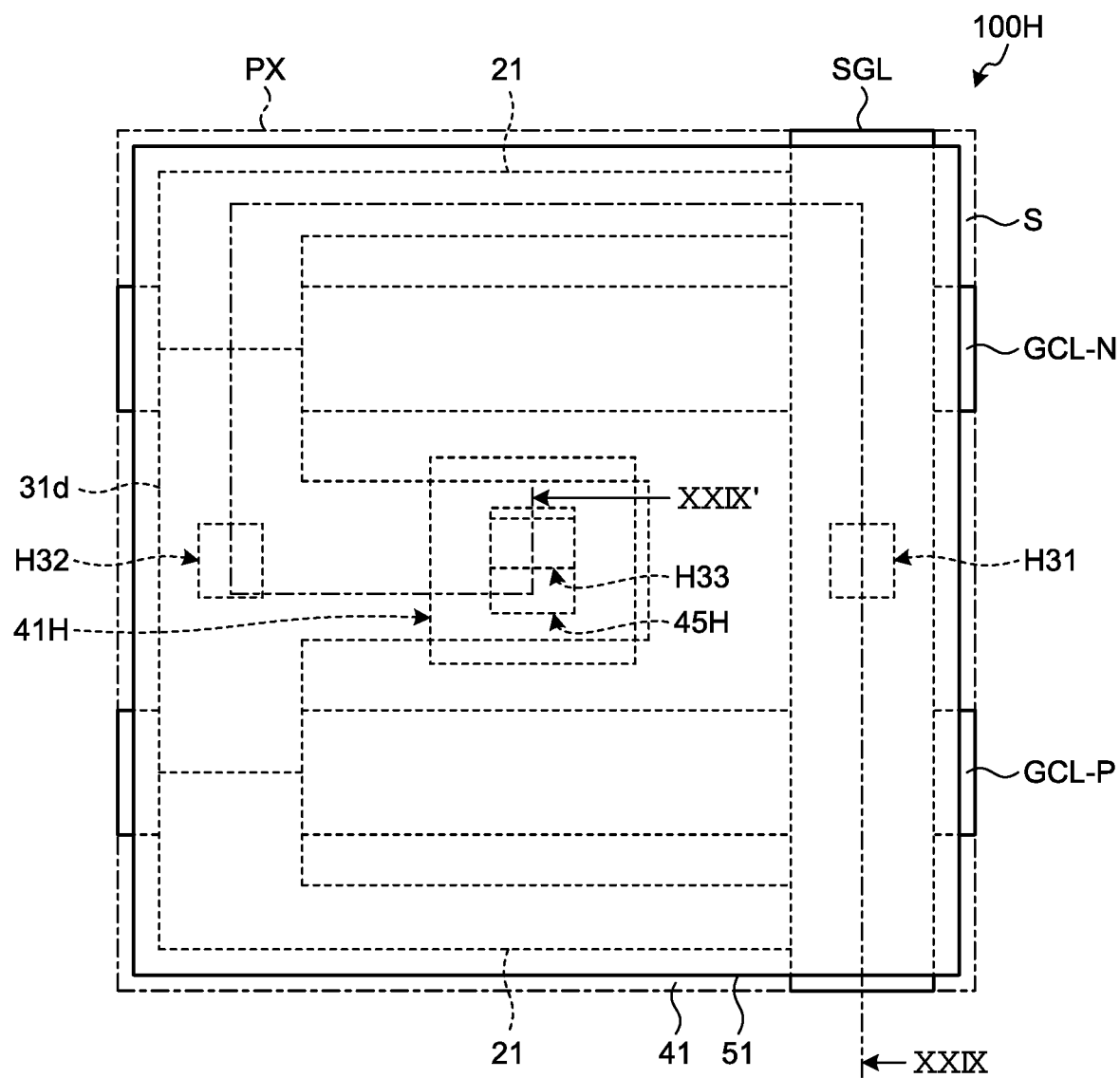
FIG. 28 is a plan view illustrating a configuration example of one of the pixels of the TFT substrate according to the third embodiment.
Figure 29:
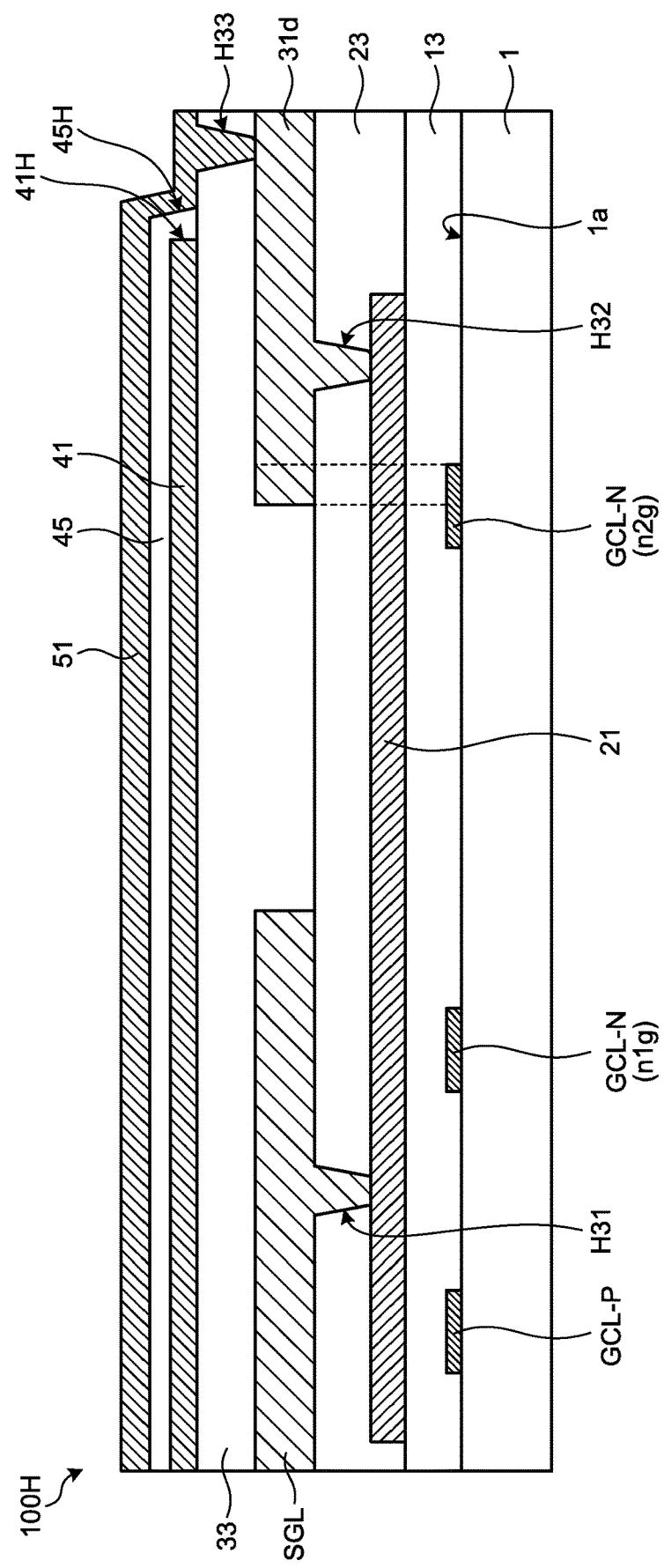
FIG. 29 is a sectional view obtained by cutting the plan view illustrated in FIG. 28 along line XXIX-XXIX'.
Figure 30:
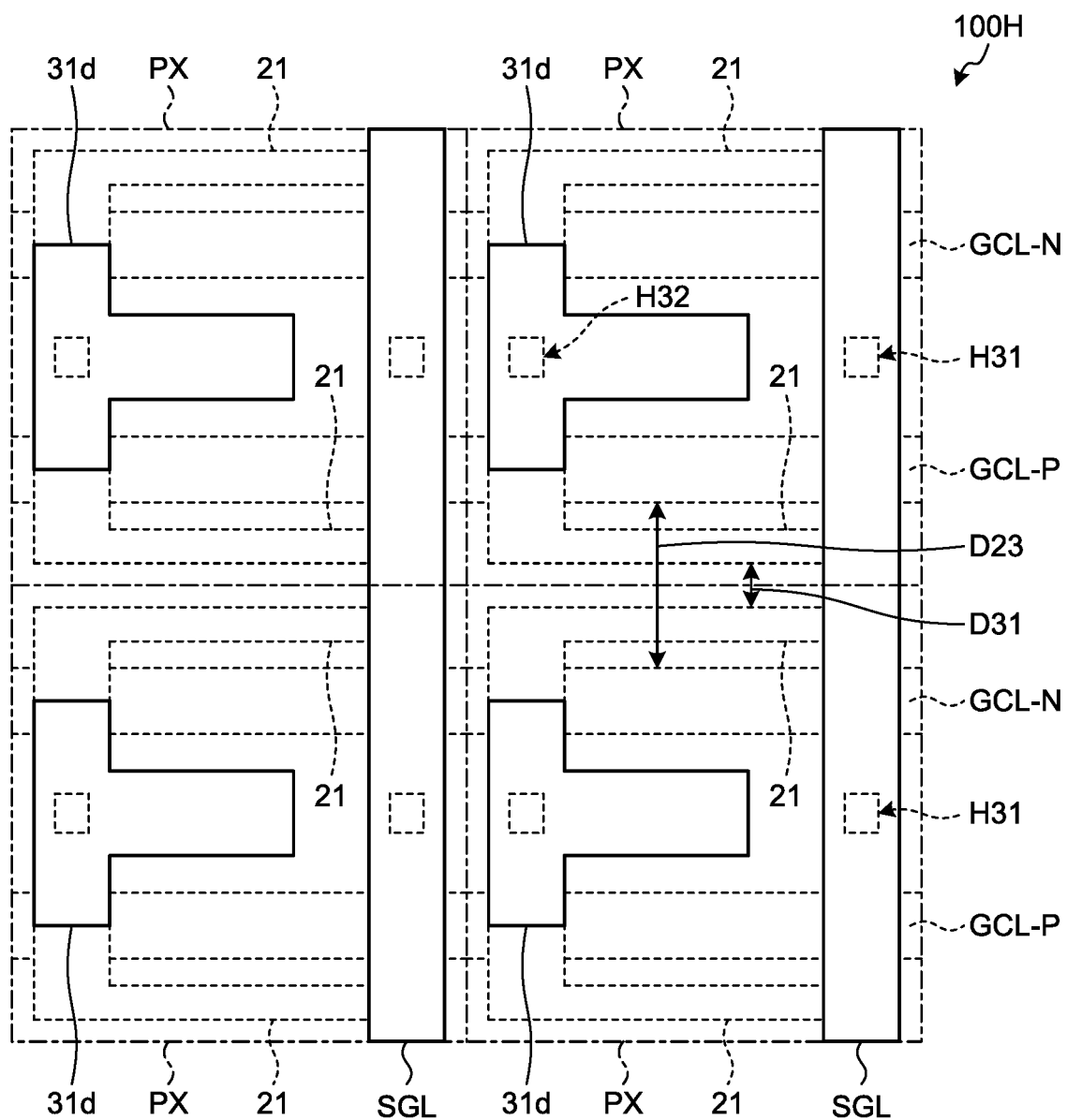
FIG. 30 is a plan view illustrating relations among the gate lines and the semiconductor films between adjacent pixels on the TFT substrate according to the third embodiment.

FIG. 26 is a plan view illustrating a configuration example of the gate line, the semiconductor film, and the signal line in one of the pixels of a TFT substrate according to the third embodiment. FIG. 27 is a plan view illustrating a configuration example of the signal line and the drain in one of the pixels of the TFT substrate according to the third embodiment. FIG. 27 illustrates portions covered with the interlayer insulating film 23 with dashed lines. FIG. 28 is a plan view illustrating a configuration example of one of the pixels of the TFT substrate according to the third embodiment. FIG. 28 illustrates portions covered with the pixel electrode 51 with dashed lines. To avoid complexity of the drawing, FIG. 28 does not illustrate the planarizing film 33 (refer to FIG. 29), the interlayer insulating film 23, and the insulating film 13 (refer to FIG. 29). FIG. 29 is a sectional view obtained by cutting the plan view illustrated in FIG. 28 along line XXIX-XXIX'. FIG. 30 is a plan view illustrating relations among the gate lines and the semiconductor films between adjacent pixels on the TFT substrate according to the third embodiment.

As illustrated in FIG. 26, a TFT substrate 100H according to the third embodiment includes the gate line GCL, the signal line SGL intersecting with the gate line GCL in the plan view, and the semiconductor film 21 coupled to the signal line SGL. The gate line GCL includes the first gate line GCL-N extending in the X-direction and the second gate line GCL-P extending in the X-direction. Each of the first gate line GCL-N and the second gate line GCL-P is constituted by only a gate main line extending in the X-direction. The first gate line GCL-N and the second gate line GCL-P are adjacent to each other in the Y-direction.

As illustrated in FIG. 26, the shape of the semiconductor film 21 in the plan view is, for example, a rectangular annular shape. The first gate line GCL-N intersects with the annular semiconductor film 21 in the plan view. Portions of the first gate line GCL-N intersecting with the annular semiconductor film 21 in the plan view serve as the gates of the NMOS transistor NTR. For example, one of the two portions of the first gate line GCL-N overlapping with the annular semiconductor film 21 in the plan view serves as the gate of the first NMOS transistor ntr1, and the other of the two portions serves as the gate of the second NMOS transistor ntr2.

In the same way, the second gate line GCL-P also intersects with the annular semiconductor film 21 in the plan view. Portions of the second gate line GCL-P intersecting with the annular semiconductor film 21 serve as the gates of the PMOS transistor PTR. For example, one of the two portions of the second gate line GCL-P overlapping with the annular semiconductor film 21 in the plan view serves as the gate of the first PMOS transistor ptr1, and the other of the two portions serves as the gate of the second PMOS transistor ptr2.

As illustrated in FIG. 27, a portion of the semiconductor film 21 overlaps with the signal line SGL in the plan view. The first NMOS transistor ntr1 and the first PMOS transistor ptr1 are disposed in regions of the semiconductor film 21 overlapping with the signal line SGL in the plan view. A contact hole H31 coupling the semiconductor film 21 to the signal line SGL is disposed in a region of the semiconductor film 21 overlapping with the signal line SGL in the plan view.

As illustrated in FIG. 29, the interlayer insulating film 23 is provided on the semiconductor film 21. The signal line SGL and the drain 31d are provided on the interlayer insulating film 23. The semiconductor film 21 is coupled to the drain 31d through a contact hole H32. The contact hole H32 is provided at a location facing the contact hole H31 in the X-direction.

As illustrated in FIG. 26, in the TFT substrate 100H according to the third embodiment, the line width W21 of a portion of the semiconductor film 21 intersecting with the first gate line GCL-N or the second gate line GCL-P is equal to or smaller than the value of the line width W31 of the signal line SGL (W21≤W31). With this configuration, the signal line SGL covers the whole region of the gate of the first NMOS transistor ntr1 and the whole region of the gate of the first PMOS transistor ptr1. As illustrated in FIG. 27, in the TFT substrate 100H, the drain 31d covers the drain side of the gate of the second NMOS transistor ntr2 and the drain side of the gate of the second PMOS transistor ptr2.

As illustrated in FIG. 29, the contact holes H31 and H32 are formed in the interlayer insulating film 23. A contact hole H33 illustrated in FIG. 28 is formed in the planarizing film 33 as illustrated in FIG. 29. The drain 31d is coupled to the pixel electrode 51 through the contact hole H33.

As described above, the TFT substrate 100H according to the third embodiment includes the gate line GCL extending in the X-direction, the signal line SGL that extends in the Y-direction in a layer different from that of the gate line GCL, and intersects with the gate line GCL, the semiconductor film 21 that is provided in a layer different from those of the gate line GCL and the signal line SGL, and intersects with the gate line GCL, and the drain 31d and the signal line SGL that are provided in a layer different from those of the gate line GCL and the semiconductor film 21, and cover at least portions of regions where the gate line GCL intersects with the semiconductor film 21. With this configuration, the drain 31*d* and the signal line SGL can block the light from reaching the gate of the pixel transistor TR located closer to the base material 1 than the drain 31*d* and the signal line SGL.

For example, the signal line SGL is disposed at a location overlapping with the whole region of the gate of the first NMOS transistor ntr1 and the whole region of the gate of the first PMOS transistor ptr1, and the drain 31*d* is disposed at a location overlapping with the drain side of the gate of the second NMOS transistor ntr2 and the drain side of the gate of the second PMOS transistor ptr2. To take an example, as illustrated in FIG. 27, one end 311A in the Y-direction of the drain 31*d* is disposed at a location overlapping with the drain side of the gate of the second NMOS transistor ntr2, and another end 311B in the Y-direction of the drain 31*d* is disposed at a location overlapping with the drain side of the gate of the second PMOS transistor ptr2. This configuration shields at least a portion on the drain side of the pixel transistor TR from the light, and reduces the photoelectric conversion. As a result, the TFT substrate 100H can reduce the possible malfunction of the pixel transistor TR, and can improve the reliability.

The semiconductor film 21 includes a linear portion 211 extending parallel to the first gate line GCL-N, a linear portion 212 extending parallel to the second gate line GCL-P, a linear portion 213 intersecting with the gate line CGL at locations away from the signal line SGL in the X-direction, and a linear portion 214 intersecting with the gate line CGL at locations overlapping with the signal line SGL. With this configuration, the linear portion 213 does not overlap with the signal line SGL. As a result, the TFT substrate 100H can reduce the parasitic capacitance between the semiconductor film 21 and the signal line SGL to a lower level than that when the linear portion 213 overlaps with the signal line SGL.

The gate line CGL includes the first gate line CGL-N extending in the X-direction and the second gate line CGL-P adjacent to the first gate line CGL-N in the Y-direction. The linear portion 213 intersects with the first gate line CGL-N and the second gate line CGL-P at the locations away from the signal line SGL in the X-direction. The linear portion 214 intersects with the first gate line CGL-N and the second gate line CGL-P at the locations overlapping with the signal line SGL. With this configuration, the pixel transistor TR of the TFT substrate 100H can have the complementary MOS (CMOS) configuration. As compared with the case where the pixel transistor does not have the CMOS configuration, the TFT substrate 100H can reduce the voltage amplitude applied to each of the NMOS transistor NTR and the PMOS transistor PTR, and thus, the withstand voltages of the PMOS transistor PTR and the NMOS transistor NTR constituting the pixel transistor TR can be set lower.

With the TFT substrate 100H according to the third embodiment, the gate line CGL is located closer to the center in the Y-direction of the pixel PX than an outer rim of the semiconductor film 21. This configuration can reduce a separation distance D31 between the semiconductor films 21 in the pixels PX adjacent in the Y-direction while ensuring a large separation distance D23 between the first gate line CGL-N and the second gate line CGL-P, as illustrated in FIG. 30. As a result, the TFT substrate 100H can achieve a further higher definition.

An aspect of the TFT substrate 100H according to the third embodiment can be described in the following way.

The semiconductor film 21 has the linear portion 211 (an example of the first linear portion of the present disclosure) extending parallel to the first gate line GCL-N and the linear portion 212 (an example of the second linear portion of the present disclosure) extending parallel to the second gate line GCL-P. In the plan view, the first gate line GCL-N and the second gate line GCL-P are located between the linear portion 211 and the linear portion 212. In the plan view, the contact hole H33 (an example of the first contact hole of the present disclosure) of the planarizing film 33 coupling the drain electrode 31*d* to the pixel electrode 51 is located between the first gate line GCL-N and the second gate line GCL-P.

The semiconductor film 21 further has the linear portion 213 (an example of the third linear portion of the present disclosure) extending parallel to the signal line SGL. The linear portion 213 couples the linear portion 211 to the linear portion 212.

The contact hole H32 (an example of the second contact hole of the present disclosure) coupling the linear portion 213 to the drain electrode 31*d* is located between the first gate line GCL-N and the second gate line GCL-P in the plan view.

The semiconductor film 21 further includes the linear portion 214 (an example of a fourth linear portion of the present disclosure) extending parallel to the signal line SGL. The linear portion 214 couples the linear portion 211 to the linear portion 212. The signal line SGL is coupled to the linear portion 214 through the contact hole H31 (an example of a fifth linear portion of the present disclosure) formed in the interlayer insulating film 23. The contact hole H31 is located between the first gate line GCL-N and the second gate line GCL-P in the plan view.

The shape in the plan view of the semiconductor film 21 having the linear portions 211, 212, 213, and 214 is an annular shape.

The linear portion 213 does not overlap with the signal line SGL, and the linear portion 214 overlaps with the signal line SGL. Each of the linear portions 213 and 214 intersects with the first gate line GCL-N and the second gate line GCL-P.

Modification

In the above-described first to third embodiments, the description has been made that the pixel transistor TR has the complementary MOS (CMOS) configuration, and includes both the NMOS transistor NTR and the PMOS transistor PTR. In the present embodiment, however, the pixel transistor TR is not limited to the complementary MOS (CMOS) configuration. The pixel transistor TR may have a configuration including only either one of the NMOS transistor NTR and the PMOS transistor PTR.

Figure 31:
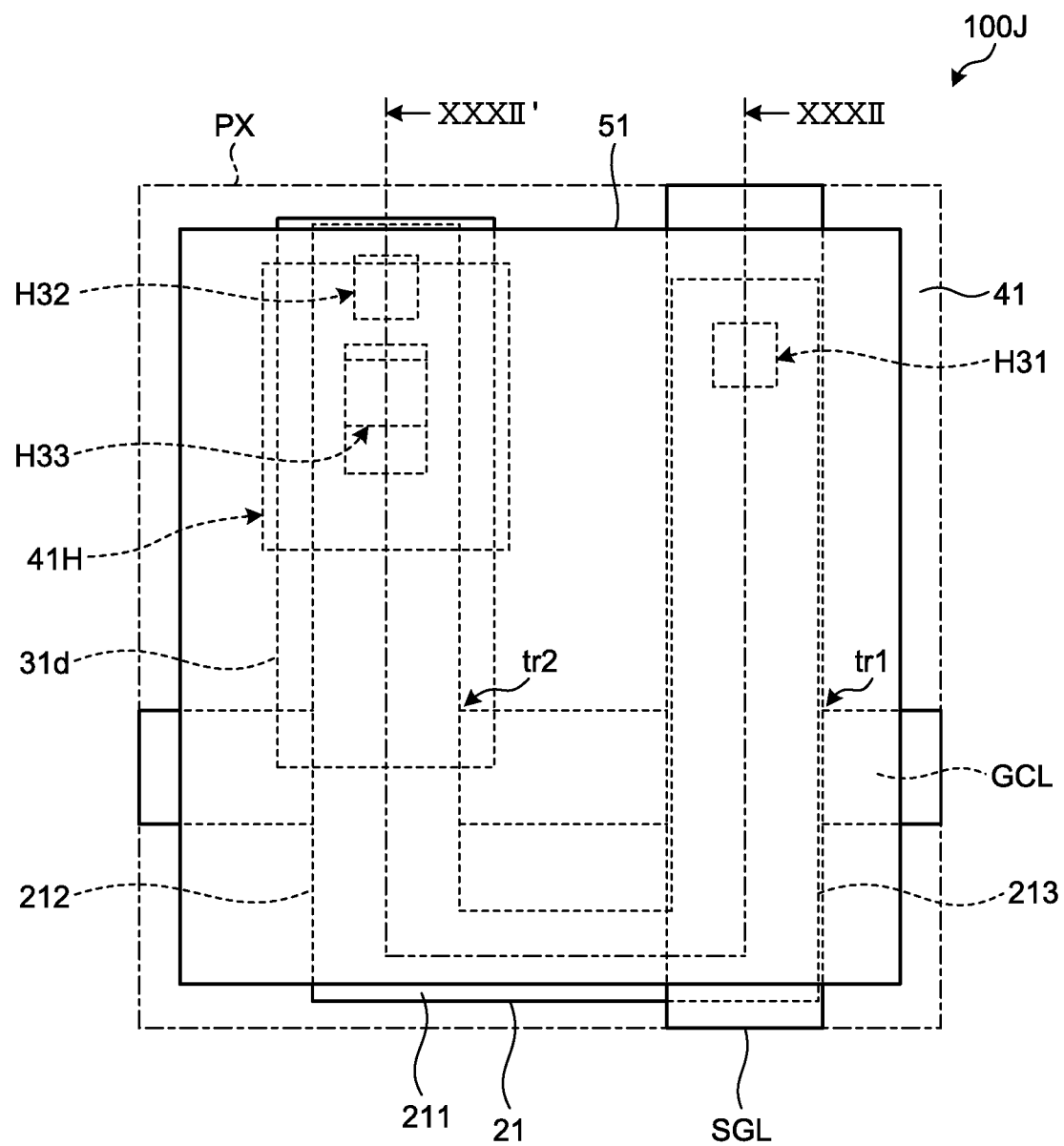
FIG. 31 is a plan view illustrating a configuration example of a TFT substrate according to a modification of the third embodiment.
Figure 32:
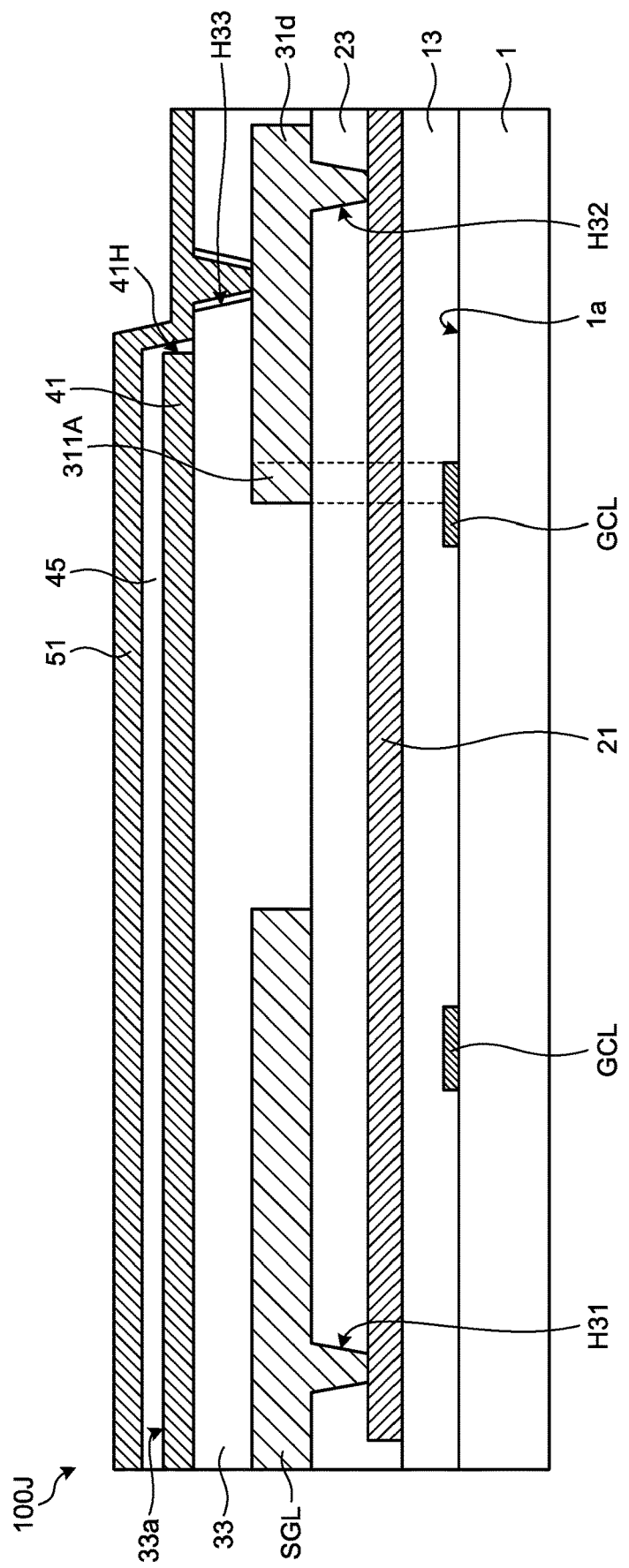
FIG. 32 is a sectional view obtained by cutting the plan view illustrated in FIG. 31 along line XXXII-XXXII'.

FIG. 31 is a plan view illustrating a configuration example of a TFT substrate according to a modification of the third embodiment. FIG. 32 is a sectional view obtained by cutting the plan view illustrated in FIG. 31 along line XXXII-XXXII'. In a TFT substrate 100J according to the modification of the third embodiment, the pixel transistor TR is an NMOS transistor or a PMOS transistor. In the TFT substrate 100J, one gate line GCL is coupled to one pixel.

As illustrated in FIG. 31, the shape in the plan view of the semiconductor film 21 is, for example, a U-shape. That is, the semiconductor film 21 has the linear portions 211, 212, and 213. The linear portion 212 is coupled to one end of the linear portion 211, and the linear portion 213 is coupled to the other end of the linear portion 211. The linear portion 211 and the linear portion 212 form an angle of about 90 degrees.

The linear portion 211 and the linear portion 213 also form an angle of about 90 degrees.

As illustrated in FIG. 31, the pixel transistor TR includes a first MOS transistor tr1 and a second MOS transistor tr2. A portion of the gate line GCL intersecting with the linear portion 213 of the semiconductor film 21 serves as the gate of the first MOS transistor tr1. A portion of the gate line GCL intersecting with the linear portion 212 of the semiconductor film 21 serves as the gate of the second MOS transistor tr2. The first MOS transistor tr1 is coupled in series to the second MOS transistor tr2.

In the same way as the TFT substrate 100H according to the third embodiment, the TFT substrate 100J according to the modification of the third embodiment can improve the reliability and achieve a higher definition.

The preferred embodiments of the present disclosure have been described above. The present disclosure is, however, not limited to the embodiments described above. The contents disclosed in the embodiments are merely examples, and can be variously modified within the scope not departing from the gist of the present disclosure. Any modifications appropriately made within the scope not departing from the gist of the present disclosure also naturally belong to the technical scope of the present disclosure.

What is claimed is:

1. A thin film transistor (TFT) substrate comprising:
   a first gate line and a second gate line extending in a first direction;
   a signal line intersecting with the first gate line and the second gate line in a plan view;
   a semiconductor film coupled to the signal line;
   a drain electrode coupled to the semiconductor film;
   a planarizing film covering the signal line and the drain electrode; and
   a pixel electrode coupled to the drain electrode, wherein the semiconductor film comprises:
      a first linear portion extending parallel to the first gate line;
      a second linear portion extending parallel to the second gate line, and
      a third linear portion extending parallel to the signal line, the third linear portion coupling the first linear portion to the second linear portion,
   the first gate line and the second gate line are located between the first linear portion and the second linear portion in the plan view,
   the third linear portion intersects with the first gate line and the second gate line, and does not overlap with the signal line, and
   a first contact hole of the planarizing film coupling the drain electrode to the pixel electrode is located between the first gate line and the second gate line in the plan view.

2. The TFT substrate according to claim 1, further comprising an interlayer insulating film between the semiconductor film and the drain electrode,
   wherein a second contact hole of the interlayer insulating film coupling the third linear portion to the drain electrode is located between the first gate line and the second gate line in the plan view.

3. The TFT substrate according to claim 2, further comprising:
   a third contact hole of the interlayer insulating film; and
   a fourth contact hole of the interlayer insulating film, wherein
   the third contact hole couples the first linear portion to the signal line, and
   the fourth contact hole couples the second linear portion to the signal line.

4. The TFT substrate according to claim 2, wherein
   the semiconductor film further comprises a fourth linear portion extending parallel to the signal line,
   the fourth linear portion couples the first linear portion to the second linear portion,
   the signal line is coupled to the fourth linear portion through a fifth contact hole formed in the interlayer insulating film, and
   the fifth contact hole is located between the first gate line and the second gate line in the plan view.

5. A thin film transistor (TFT) substrate comprising:
   a first gate line;
   a second gate line parallel to the first gate line;
   a signal line intersecting with the first gate line and the second gate line in a plan view; and
   a semiconductor film that intersects with the first gate line and the second gate line in the plan view, and is coupled to the signal line, wherein
   the semiconductor film comprises a first linear portion parallel to the first gate line, a second linear portion parallel to the second gate line, and a third linear portion parallel to the signal line,
   the third linear portion couples the first linear portion to the second linear portion, and
   the third linear portion intersects with the first gate line and the second gate line, and does not overlap with the signal line.

6. The TFT substrate according to claim 5, wherein
   the semiconductor film further comprises a fourth linear portion parallel to the signal line,
   the fourth linear portion couples the first linear portion to the second linear portion, and
   the semiconductor film has an annular shape in the plan view.

7. The TFT substrate according to claim 6, wherein
   the fourth linear portion overlaps with the signal line, and
   the fourth linear portion intersects with the first gate line and the second gate line.

8. The TFT substrate according to claim 5, further comprising:
   a base material having an insulating property;
   a pixel electrode provided on one surface side of the base material; and
   a pixel transistor provided between the base material and the pixel electrode, wherein
   the pixel transistor comprises:
      an n-channel metal-oxide semiconductor (NMOS) transistor; and
      a p-channel metal-oxide semiconductor (PMOS) transistor coupled in parallel to the NMOS transistor,
   a gate of the NMOS transistor is coupled to the first gate line,
   a source of the NMOS transistor is coupled to the signal line,
   a drain of the NMOS transistor is coupled to the pixel electrode,
   a gate of the PMOS transistor is coupled to the second gate line,
   a source of the PMOS transistor is coupled to the signal line, and
   a drain of the PMOS transistor is coupled to the pixel electrode.

* * * * *